(12) United States Patent
Jigami et al.

(10) Patent No.: US 9,999,994 B2
(45) Date of Patent: *Jun. 19, 2018

(54) METHOD FOR PRODUCING PRODUCT HAVING UNEVEN MICROSTRUCTURE ON SURFACE THEREOF, MOLD RELEASE TREATMENT METHOD, AND ACTIVE ENERGY RAY CURABLE RESIN COMPOSITION FOR MOLD SURFACE RELEASE TREATMENT

(75) Inventors: Tetsuya Jigami, Hiroshima (JP); Masayuki Uchida, Hiroshima (JP); Shinji Makino, Hiroshima (JP); Tadashi Nakamura, Tokyo (JP); Takaya Kawasoe, Toyama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 551 days.

This patent is subject to a terminal disclaimer.

(21) Appl. No.: 13/702,075

(22) PCT Filed: Jun. 7, 2011

(86) PCT No.: PCT/JP2011/063079
§ 371 (c)(1),
(2), (4) Date: Dec. 5, 2012

(87) PCT Pub. No.: WO2011/155499
PCT Pub. Date: Dec. 15, 2011

(65) Prior Publication Data
US 2013/0075962 A1 Mar. 28, 2013

(30) Foreign Application Priority Data

Jun. 7, 2010 (JP) .................................. 2010-130366
Oct. 28, 2010 (JP) .................................. 2010-242375

(51) Int. Cl.
*B29C 41/42* (2006.01)
*B29C 33/62* (2006.01)
(Continued)

(52) U.S. Cl.
CPC .............. *B29C 41/42* (2013.01); *B29C 33/62* (2013.01); *B29C 43/222* (2013.01); *B29C 43/28* (2013.01);
(Continued)

(58) Field of Classification Search
CPC ................ B29C 35/08; B29C 35/0805; B29C 2035/0827; B29C 35/0866;
(Continued)

(56) References Cited

U.S. PATENT DOCUMENTS 4,935,175 A * 6/1990 Kitaura .................... B08B 1/00
106/38.6
9,052,444 B2 * 6/2015 Nakai et al.
(Continued)

FOREIGN PATENT DOCUMENTS

JP 2007-326367 12/2007
JP 4154595 9/2008
(Continued)

OTHER PUBLICATIONS

"Office Action of Taiwan Counterpart Application", dated Sep. 11, 2013, pp. 1-5.

*Primary Examiner* — Matthew J Daniels
*Assistant Examiner* — Leith S Shafi
(74) *Attorney, Agent, or Firm* — JCIPRNET

(57) ABSTRACT

The producing method includes: (I) providing an active energy ray curable resin composition for mold surface release treatment between a mold having uneven microstructure on its surface and a substrate, and after curing the resin composition by irradiation with an active energy ray, peeling (Continued)

off the substrate together with a cured article of the active energy ray curable resin composition from the surface of the mold, thereby performing a release treatment to the surface of the mold; and (II), after step (I), providing an active energy ray curable resin composition for shaping between the substrate and the mold, the surface of which has been treated by the release treatment, and after curing the resin composition by an active energy ray, peeling off the substrate together with a cured article of the active energy ray curable resin composition for shaping from the surface of the mold.

6 Claims, 2 Drawing Sheets

(51) Int. Cl.
*B29C 43/22* (2006.01)
*B29C 43/28* (2006.01)
*B29C 59/04* (2006.01)
*B32B 38/06* (2006.01)
*C08F 283/06* (2006.01)
*H01L 31/0216* (2014.01)
*H01L 31/0236* (2006.01)
*B29C 59/02* (2006.01)

(52) U.S. Cl.
CPC .............. *B29C 59/04* (2013.01); *B32B 38/06* (2013.01); *C08F 283/065* (2013.01); *H01L 31/02168* (2013.01); *H01L 31/02366* (2013.01); *B29C 2059/023* (2013.01); *Y02E 10/50* (2013.01)

(58) Field of Classification Search
CPC ..... B29C 35/0888; B29C 59/16; B29C 41/42; B29C 33/62; B29C 43/222; B29C 43/28; B29C 2059/023; B29C 33/72; B29C 37/0053; B29C 33/40; B29C 33/424; B32B 38/06; H01L 31/02366; H01L 31/02168; C08F 283/065; Y02E 10/50; B08B 7/0014; B29L 2031/3475; H01J 9/244; H01J 2211/36
USPC ....... 264/405, 494, 496, 446, 447, 482, 213, 264/2.3, 300, 39; 425/74, 174.4, 177, 425/502, 436 R, 438, 436 RM, 174
See application file for complete search history.

(56) References Cited

U.S. PATENT DOCUMENTS

2007/0126158 A1 6/2007 Saito et al.
2010/0243458 A1 9/2010 Kojima et al.

FOREIGN PATENT DOCUMENTS

| JP | 2009-266841 | 11/2009 |
| TW | 200940320 | 10/2009 |
| WO | WO 0194460 A2 * | 12/2001 |

* cited by examiner

METHOD FOR PRODUCING PRODUCT HAVING UNEVEN MICROSTRUCTURE ON SURFACE THEREOF, MOLD RELEASE TREATMENT METHOD, AND ACTIVE ENERGY RAY CURABLE RESIN COMPOSITION FOR MOLD SURFACE RELEASE TREATMENT

CROSS-REFERENCE TO RELATED APPLICATIONS

This application is a 371 of international application of PCT application serial no. PCT/JP2011/063079, filed on Jun. 7, 2011, which claims priority benefit of Japan application no. 2010-130366, filed on Jun. 7, 2010 and Japan application no. 2010-242375, filed on Oct. 28, 2010. The entirety of each of the above-mentioned patent applications is hereby incorporated by reference herein and made a part of this specification.

BACKGROUND OF THE INVENTION

Field of the Invention

The invention relates to a method for producing a product having an uneven microstructure on a surface thereof, a mold release treatment method, and an active energy ray curable resin composition for mold surface release treatment.

Description of Related Art

In recent years, it is known that the products with the uneven microstructure thereon present antireflection effects, lotus effects and the like, whereas the period of the uneven microstructure is equal to or less than the wavelength of visible light. Particularly, because the refractive indices keep increasing continuously from the refractive index of the air to the refractive index of the product, the uneven structure that is constructed with approximately convex cone structures, so-called the moth-eye-structure, becomes an effective antireflection means.

As a method of forming an uneven microstructure on the surface of the product, the following method arouses interest: a mold having an uneven microstructure formed on the surface thereof (also called a metallic mold, and will be called "mold" in this disclosure hereinafter) is used and the uneven microstructure of the mold is transferred to the surface of the product. In details, a liquid active energy ray curable resin composition is inserted between the substrate and the mold having the uneven microstructure on the surface thereof, the active energy ray curable resin composition is cured by irradiation with an active energy ray to form a cured resin layer, onto which the uneven microstructure is transferred, on the surface of the substrate. In aforesaid method, the quality of the releasability of the mold from the surface of the product has a significant impact on the productivity of the product. That is, in the method, when the mold is released from the surface of the cured resin layer, defects may be generated in the transferred uneven microstructure as resin residue occurs on the surface of the mold.

As a method for improving the releasability between the cured resin layer and the mold, the following methods have been proposed.

(1) The method uses the release agent (external release agent) to treat the mold surface at the side formed with the uneven microstructure (Patent Documents 1 and 2).

(2) The method adds a release agent (internal release agent) to the material constituting the product.

However, for the method of (1), the following problems exist.

(i) After applying a dilute solution of the release agent to the mold or immersing the mold in a dilute solution of the release agent, it is necessary to dry up the mold, which makes the release treatment become time consuming and complicated.

(ii) Uneven treatment such as uneven drying of the release agent may be caused.

(iii) The release agent on the surface of the mold is likely to transit to the surface of the product.

(iv) As the release agent is not sufficiently spread out to every corner of the uneven microstructure of the mold, it is difficult to treat uniformly and sufficiently the region of the uneven microstructure of the mold with the release agent. In addition, when an extraneous substance is attached to the region of the uneven microstructure of the mold, it is difficult to use the release agent to treat the portion adhered with the extraneous substance. Therefore, for the portion of the mold surface being insufficiently treated with the release agent, defects may occur in the transferred uneven microstructure. In addition, for the portion of the mold surface being insufficiently treated with the release agent, the cured resin may be cracked and have residue, resulting in the occurrence of defects in the uneven microstructure itself of the mold. Hence, under the circumstance of using the same mold continuously, defects may be repeated over and over.

Furthermore, for the method (2), the following problems exist.

(v) Because the addition amount of the release agent is set to make the contamination degree of the release agent on the surface of the product not an issue, the releasability may be insufficient.

(vi) On the other hand, when the release agent is added in excess, the surface of the product is contaminated by the release agent and the product is generated with a poor appearance.

As a method of removing extraneous substances attached to the region of the uneven microstructure of the mold, the following method has been proposed.

(3) An adhesion member that has higher adhesion to the mold than to the substrate is pressed against the mold surface at the side formed with the uneven microstructure (Patent Document 3).

However, in the method (3), because the adhesion member that has higher adhesion to the mold than to the substrate is used, there is a possibility that the adhesion member adheres to the mold (i.e. the resin residue occurs). Further, in order to prevent the adhesion member from adhering to the mold (the resin residue), the surface of the mold is treated with the release agent (external release agent) in advance; however, the problem that it is difficult to treat the portion attached with extraneous substances with the release agent still remains. In addition, the release agent is peeled off from the mold by the adhesion member, along with the extraneous substances. In this way, in the method (3), even if the extraneous substances may be removed, defects may occur in the transferred uneven microstructure due to the peeling of the release agent from the mold or the adhesion of the adhesion member to the mold.

REFERENCES LIST

Patent Literature

Patent literature 1: Japanese Patent Publication No. 2007-326367
Patent literature 2: Japanese Patent No. 4154595
Patent literature 3: Japanese Patent Publication No. 2009-266841

SUMMARY OF THE INVENTION

Problems that the Invention is to Solve

The invention provides an active energy ray curable resin composition for a mold surface release treatment and a mold release treatment method, which offer excellent releasability to the surface of a mold having an uneven microstructure thereon in a short period of time with ease and without inconsistency. Also, a method of producing a product that is transferred accurately with the uneven microstructure of the mold and has the uneven microstructure with suppressed surface contamination caused by the release agent is provided with high productivity.

Further, the invention provides a producing method of a product having the uneven microstructure thereon, which suppresses the defects in the uneven microstructure that is transferred from the mold.

Means for Solving the Problems

Before using the commonly used active energy ray curable resin composition for shaping for transferring the uneven microstructure of the mold to the surface of the substrate to form the product, the inventors use an active energy ray curable resin composition for the mold surface release treatment that is enriched with comparatively more release agent to transfer the uneven microstructure of the mold to the surface of the substrate to fabricate the simulated product, thus imparting the releasability to the mold surface. In addition, if the indentation elastic modulus of the cured article of the active energy ray curable resin composition for the mold surface release treatment is too high, it is confirmed that the uneven microstructure of the cured article is brittle, which is broken and remained on the surface of the mold during demolding. Moreover, if the indentation elastic modulus of the cured article of the active energy ray curable resin composition for the mold surface release treatment is too low, it is conformed that the cured article is cracked and remained on the surface of the mold. Further, when using the commonly used active energy ray curable resin composition for shaping to transfer the uneven microstructure of the mold to the surface of the substrate to form product, it is confirmed that transfer failure happens, which is caused by the cured article of the active energy ray curable resin composition for the mold surface release treatment remained on the mold surface. Thus, it is found that superior releasability can be exhibited under the situation that the indentation elastic modulus of the cured article of the active energy ray curable resin composition for the mold surface release treatment and the amount of the release agent are besting the specific range, thus the present invention has been achieved.

The first aspect of the invention relates to a method for producing a product having an uneven microstructure on a surface thereof, including the following steps (I)-(II).

(I) the step of supplying an active energy ray curable resin composition for the mold surface release treatment between the substrate and the mold having a surface with an uneven microstructure thereon, curing the active energy ray curable resin composition by irradiation with an active energy ray and peeling off the substrate and the cured article of the active energy ray curable resin composition for the mold surface release treatment from the mold surface so as to perform a release treatment to the mold surface.

(II), after Step (I), the step of supplying an active energy ray curable resin composition for shaping, which is different from the active energy ray curable resin composition for the mold surface release treatment, between the substrate and the mold where the surface has been treated by the release treatment, curing the active energy ray curable resin composition by irradiation with an active energy ray, and peeling off the substrate and the cured article of the active energy ray curable resin composition from the mold surface so as to obtain the product having the uneven microstructure, which corresponds to the uneven microstructure of the mold, on the surface thereof.

The second aspect of the invention relates to a method for producing a product having the uneven microstructure on the surface thereof, further including treating the mold using an external release agent before Step (I) of the first aspect.

The third aspect of the invention relates to a method for producing a product having the uneven microstructure on the surface thereof, wherein, in the first aspect, the active energy ray curable resin composition for the mold surface release treatment includes a polymerizable compound (A), an active energy ray polymerization initiator (B) and a release agent (C), and is cured by irradiation with an active energy ray of the accumulated light energy of 1000 mJ/cm$^2$ and the indentation elastic modulus of the cured article of the active energy ray curable resin composition is 5-1000 MPa at 23° C.

The fourth aspect of the invention relates to a method for producing a product having the uneven microstructure on the surface thereof, wherein, in the second aspect, the active energy ray curable resin composition for the mold surface release treatment includes a polymerizable compound (A), an active energy ray polymerization initiator (B) and a release agent (C), and is cured by irradiation with an active energy ray of the accumulated light energy of 1000 mJ/cm$^2$ and the indentation elastic modulus of the cured article of the active energy ray curable resin composition is 5-2000 MPa at 23° C.

The fifth aspect of the invention relates to a method for producing a product having the uneven microstructure on the surface thereof, wherein, in the third or fourth aspect, the release agent (C) is (poly)oxyalkylene alkyl phosphate ester compound.

The sixth aspect of the invention relates to a method for producing a product having the uneven microstructure on the surface thereof, wherein, in the fourth aspect, the release agent (C) is a release agent that is different from the external release agent.

The seventh aspect of the invention relates to a method for producing a product having the uneven microstructure on the surface thereof, wherein, in the second aspect, the external release agent is a fluoro-compound having a hydrolyzable silyl group.

The eighth aspect of the invention relates to a release treatment method of a mold, which includes supplying the active energy ray curable resin composition for the mold surface release treatment used in the fourth aspect or the third aspect of the invention to the surface of the mold having a surface with the uneven microstructure, curing the active energy ray curable resin composition by irradiation with an active energy ray, and peeling off the cured article of the active energy ray curable resin composition from the surface of the mold.

The ninth aspect of the invention relates to a method for producing a product having the uneven microstructure on the surface thereof, wherein, by using a mold, which has a surface that has been treated by the release treatment method of the eighth aspect and has an uneven microstructure thereon, the product having the uneven microstructure thereon, which corresponds to the uneven microstructure of the mold, is obtained.

The tenth aspect of the invention relates to a method for producing a product having the uneven microstructure on the surface thereof, wherein, in any one of the first to seventh aspects of the invention, the mold having the uneven microstructure on the surface thereof is a roll mold, and after the active energy ray curable resin composition is supplied between the strip substrates that move along the surface of the mold in synchronism with the rotation of the roll mold and cured by irradiation with an active energy ray, the substrate and the cured article of the active energy ray curable resin composition are peeled off from the surface of the mold.

The eleventh aspect of the invention relates to an active energy ray curable resin composition for the mold surface release treatment, which is the active energy ray curable resin composition for performing the release treatment on the surface of the mold having the uneven microstructure thereon, wherein the active energy ray curable resin composition for the mold surface release treatment includes a polymerizable compound (A), an active energy ray polymerization initiator (B) and a release agent (C), and is cured by irradiation with an active energy ray of the accumulated light energy of 1000 mJ/cm$^2$ and the indentation elastic modulus of the cured article of the active energy ray curable resin composition is 5-1000 MPa at 23° C.

The twelfth aspect of the invention relates to an active energy ray curable resin composition for the mold surface release treatment, wherein, in the eleventh aspect, the above release agent (C) is (poly)oxyalkylene alkyl phosphate ester compound.

The release agent (C) is preferably (poly)oxyethylene alkyl phosphate ester compound.

Preferably, in any one of the first to seventh aspects of the invention, the mold is a roll mold, and the substrate is a strip substrate that moves along the surface of the roll mold in synchronism with the rotation of the roll mold. Also, while the substrate is moved along the surface of the roll mold, Step (II), following Step (I), is performed continuously.

Effect of the Invention

According to the producing method of the product having the uneven microstructure on the surface thereof, as disclosed in the invention, it allows to produce the product that is transferred with the uneven microstructure of the mold in high accuracy by removing the extraneous substances adhered thereto and has the uneven microstructure with suppressed surface contamination caused by the release agent with high productivity.

According to the producing method of the product having the uneven microstructure on the surface thereof, as disclosed in the invention, the defects in the uneven microstructure that is transferred from the mold can be suppressed.

According to the release treatment method of the invention, it is possible to impart excellent releasability to the mold surface having the uneven microstructure thereon in a short period of time, with ease and without inconsistency.

According to the active energy ray curable resin composition for the mold surface release treatment of the invention, it allows to impart excellent releasability to the mold surface having the uneven microstructure thereon in a short period of time, with ease and without inconsistency.

DESCRIPTION OF THE EMBODIMENTS

Figure 1:
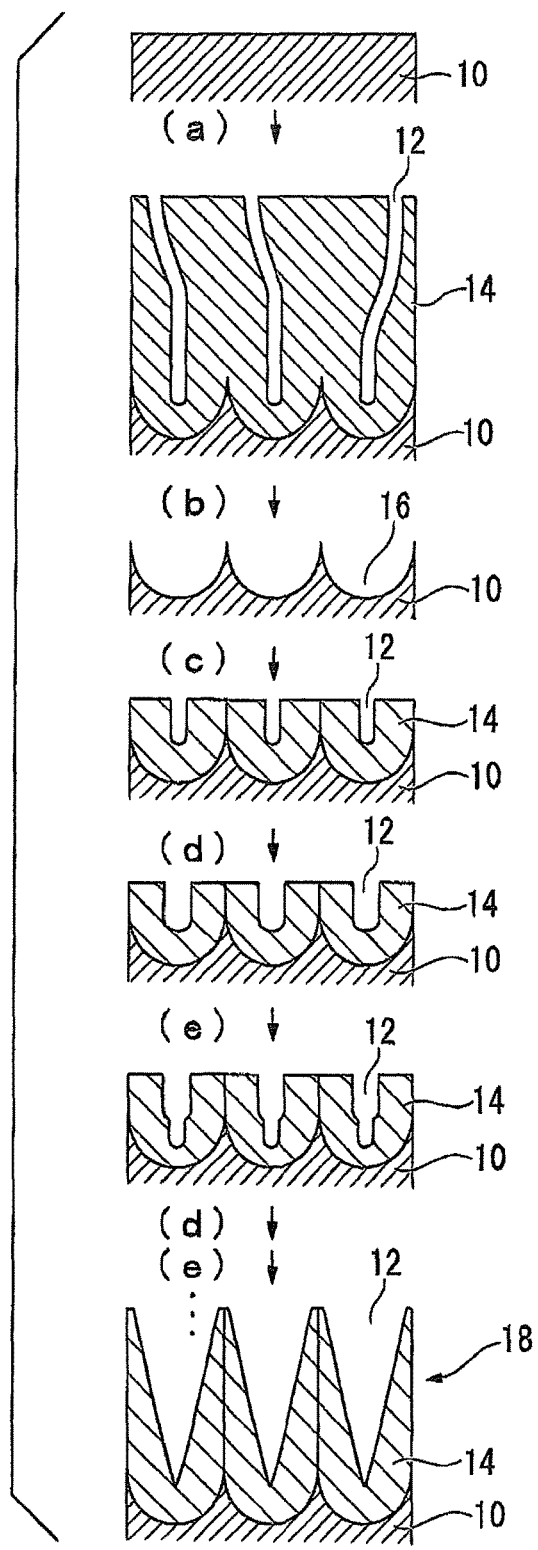
FIG. 1 is a schematic cross-sectional view showing a manufacturing process of a mold having an anodized alumina surface.

In the specification of this disclosure, (meth)acrylate represents acrylate or methacrylate. In addition, the active energy ray represents visible light, ultraviolet light, electron beam, plasma, or heat ray (infrared etc.) and the like. The uneven microstructure represents the convex or concave structures having an average interval equal to or less than the visible light wavelength, i.e. equal to or less than 400 nm. In addition, (poly)oxyalkylene alkyl phosphate ester compounds represent polyoxyalkylene alkyl phosphate ester compounds having one oxyalkylene group or polyoxyalkylene alkyl phosphate ester compounds having two or more than two oxyalkylene groups. In addition, (poly)oxyethylene alkyl phosphate ester compounds represent polyoxyethylene alkyl phosphate ester compounds having one oxyethylene group or polyoxyethylene alkyl phosphate ester compounds having two or more than two oxyethylene groups.

<Producing Method of the Product Having the Uneven Microstructure Thereon>

The method for producing a product having the uneven microstructure thereon of the invention is to use a mold having a surface that has been treated by the release treatment method of one aspect of the invention and has the uneven microstructure thereon, so as to obtain the product having the uneven microstructure (the reversal structure), which corresponds to the uneven microstructure of the mold, on the surface thereof.

Specifically, the following methods (α)-(γ) may be exemplified, and from the viewpoint of transferability of the uneven microstructure and the flexibility of the surface composition, method (β) is preferred. Method (β) has excellent productivity and is particularly suitable when using a belt mold or roll mold in continuous production.

Method (α) By using the mold having the surface that has been treated by the release treatment method of the invention and has the uneven microstructure thereon, injection molding or press-molding is performed.

Method (β) The active energy ray curable resin composition for shaping (hereinafter sometimes referred to as an active energy ray curable resin composition (Y)) is inserted between the substrate and the mold having the surface that has been treated by the release treatment method of the invention and has the uneven microstructure thereon, and is cured by irradiation with an active energy ray, and the substrate and a cured resin layer of the cured article of the active energy ray curable resin composition (Y) are peeled off from the mold surface.

Method (γ) The uneven microstructure of the mold is transferred to the active energy ray curable resin composition (Y) by pressing the mold having the surface that has been treated by the release treatment method of the invention and has the uneven microstructure thereon. Afterwards, the mold is peeled off from the active energy ray curable resin composition (Y), and the active energy ray curable resin composition (Y) is cured by irradiation with an active energy ray.

(Mold)

The mold has an uneven microstructure on the surface thereof.

The shape of the mold may be a flat plate, a roll, a belt and the like, and from the viewpoint for transferring an uneven microstructure continuously to enhance productivity, the shape of the mold is preferably roll-shaped or belt-shaped.

The mold is fabricated by forming an uneven microstructure on the surface of the mold substrate. In addition, the mold may be used as the prototype, which is used to produce a replicated mold by electro-casting and the like, and the replicated mold may be used as a mold.

The material of the mold substrate may be exemplified as metals (including the metals having the oxide film formed on the surface), quartz, glass, resins, ceramics and the like.

As a method of forming an uneven microstructure, method (δ) or method (ε) may be listed, and from the viewpoint of easy production in the large area, method (ε) is preferred.

Method (δ) The uneven microstructure on the surface of the mold substrate is formed by lithography methods (electron beam lithography, laser beam interference method, photolithography and the like).

Method (ε) The anodized alumina formed with a plurality of pores (concave) is formed on the surface of the aluminum substrate.

Method (δ):

In Method (δ), a photoresist film is formed on the surface of the mold substrate, exposed to lights such as ultraviolet laser light, electron beam, X-ray and the like, and developed so as to obtain the mold having an uneven microstructure. The developed photoresist film may be used as the mold directly. Alternatively, with use of the developed photoresist film as a template, the mold substrate is selectively etched by dry etching, followed by removing the photoresist film, and the mold having the uneven microstructure formed directly on the mold substrate is used as a mold.

Method (ε):

Method (ε) preferably includes the following steps (a)-(f).

Step (a) anodizing the aluminum substrate under a constant voltage in an electrolytic solution to form an oxide film on the surface of the aluminum substrate.

Step (b) removing the oxide film to form the pore generation spots of the anodic oxidation on the surface of the aluminum substrate.

Step (c) anodizing the aluminum substrate in the electrolytic solution again to form an oxide film having pores at the pore generation spots.

Step (d) expanding the diameter of the pore.

Step (e), after step (d), anodizing in the electrolytic solution again.

Step (f) repeating steps (d) and (e), to obtain the mold with anodized alumina having a plurality of pores formed on the surface of the aluminum substrate.

Step (a):

As shown in FIG. 1, the aluminum substrate 10 is anodized to form the oxide film 14 having pores 12.

The shape of the aluminum substrate may be exemplified as a roll, a circular tube, a flat plate, a sheet and so on.

Further, in order to smooth the surface state of the aluminum substrate, the aluminum substrate can be preferably polished by mechanical polishing, buffing, chemical polishing, electrolytic polishing (such as etching process), etc. In addition, since the oil used in processing the aluminum substrate into a predetermined shape may be attached to the aluminum substrate, it is preferred that the aluminum substrate is pre-degreased before anodic oxidation.

The purity of the aluminum is preferably 99% or more, more preferably 99.5% or more, and particularly preferably 99.8% or more. If the purity of the aluminum is low, when being anodized, uneven structure large enough to scatter visible light can be formed due to segregation of impurities, and the regularity of the pores obtained by anodic oxidation may be reduced.

For the electrolytic solution, sulfuric acid, oxalic acid, phosphoric acid and the like may be used.

When oxalic acid is used for the electrolytic solution, the concentration of oxalic acid is preferably 0.7M or less. When the concentration of oxalic acid is more than 0.7M, the current value is too high, which results in rough surface of the oxide film.

When the formation voltage is 30-60V, the anodized alumina having a high pore regularity with an average interval of 100 nm is obtained. When the formation voltage is higher or lower than this range, the pore regularity is likely to decline.

The temperature of the electrolytic solution is preferably 60° C. or less, and more preferably 45° C. or less. When the temperature of the electrolytic solution is higher than 60° C., a phenomenon called "burning" may occur or the regularity of the pores may be disturbed as the pore is damaged or the pore surface is melted.

When sulfuric acid is used for the electrolytic solution, the concentration of sulfuric acid is preferably 0.7M or less. When the concentration of sulfuric acid is more than 0.7M, the current value becomes too high and it is impossible to maintain a constant voltage.

When the formation voltage is 25-30V, the anodized alumina having a high pore regularity with an average interval of 63 nm is obtained. When the formation voltage is higher or lower than this range, the pore regularity is likely to decline.

The temperature of the electrolytic solution is preferably 30° C. or less, and more preferably 20° C. or less. When the temperature of the electrolytic solution is higher than 30° C., a phenomenon called "burning" may occur or the regularity of the pores may be disturbed as the pore is damaged or the pore surface is melted.

Step (b):

As shown in FIG. 1, once the oxide film 14 is removed, and pore generation spots 16 of the anodic oxidation are obtained. By doing so, the regularity of the pores can be improved.

The method for removing the oxide film may be exemplified by the method of immersing the aluminum substrate into a solution that selectively dissolves the aluminum oxide but does not dissolve aluminum in order to remove the oxide film. Examples of such a solution may be exemplified as a mixture solution of chromic acid/phosphoric acid and the like.

Step (c):

As shown in FIG. 1, the aluminum substrate 10, from which the oxide film is removed, is again anodized so as to form the oxide film 14 having cylindrical pores 12.

The anodic oxidation may be carried out under the same conditions as recited in the step (a). Deeper pores can be formed with longer time of the anodic oxidation.

Step (d):

As shown in FIG. 1, the process to expand the diameter of the pores 12 (hereinafter, referred to as pore diameter-expanding treatment) is performed. The pore diameter-expanding treatment is a process for expanding the diameter of the pores by immersing in the solution that dissolves the oxide film to enlarge the diameter of the pores obtained by anodic oxidation. Examples of such solutions may be exemplified as the aqueous solution of phosphoric acid of about 5 mass %, and the like.

If the pore diameter-expanding treatment is performed for longer processing time, the diameter of the pore becomes larger.

Step (e):

As shown in FIG. 1, anodic oxidation is performed again to form the cylindrical pores 12 of a small diameter extending downward from the bottom of the cylindrical pores 12.

The anodic oxidation may be carried out under the same conditions as recited in the step (a). Deeper pores can be formed with longer time of the anodic oxidation.

Step (f):

As shown in FIG. 1, the pore diameter-expanding treatment of Step (d) and the anodic oxidation of Step (e) are repetitively performed to form the oxide film 14 having the pores 12, which has an opening with the diameter shrinking along the depth direction of the opening. Hence, the mold 18 with the aluminum substrate 10 having the anodized alumina (the porous anodic oxide film, alumite) formed thereon is obtained. Preferably, the whole process is finished with the Step (d).

The repetition times are preferably three times or more in total, more preferably 5 times or more. When the repetition times are two times or less, the diameter of the pores is reduced non-continuously. Thus, when using the anodized alumina having such pores to form the moth-eye structure, the reflectivity is reduced and the effect becomes insufficient.

The shape of the pores 12 may be exemplified as substantially a cone shape, a pyramid shape, a column shape, and the like. The shapes such as cone shape and the pyramid shape, of which the pore cross-sectional area that is perpendicular to the depth direction continuously decreases from the top in the depth direction, are preferred.

The average interval of the pores 12 is equal to or less than the wavelength of visible light, that is, 400 nm. The average interval of the pores 12 is preferably equal to or more than 20 nm.

The average interval of the pores 12 is observed by using the electronic microscope to measure 10 intervals between the adjacent pores 12 (distance from the center of the pore 12 to the center of the adjacent pore 12) and determine the average value by averaging the values of the 10 intervals.

The aspect ratio of the pores 12 (the pore depth divided by the average interval between the pores) is preferably 0.8-5.0, more preferably 1.2-4.0, and particularly preferably 1.5-3.0.

The pore depth of the pores 12 is obtained by measuring the distance between the top part of the convex portion existing between the pores 12 and the bottom of the pores 12 when observed at a magnification of 30,000 by electron microscope.

(Specific Examples)

From the viewpoint of simply switching the active energy ray curable resin composition in-line and using the same apparatus for performing the mold release treatment to the mold and producing products continuously, the method of producing the product having the uneven microstructure thereon of the invention preferably includes the following steps (I)-(II).

(I) The active energy ray curable resin composition for the mold surface release treatment (X) is supplied between a mold having a surface with the uneven microstructure thereon and the substrate, and cured by irradiation with an active energy ray thereto, and then, the cured resin layer including the cured article of the active energy ray curable resin composition (X) together with the substrate are peeled off from the surface of the mold, thus performing the release treatment to the mold surface.

(II), following step (I), the active energy ray curable resin composition for shaping (Y) that is different from the active energy ray curable resin composition for the mold surface release treatment is supplied between the mold that has been treated by the release treatment and the substrate, and cured by irradiation with an active energy ray thereto, and then, the cured resin layer including the cured article of the active energy ray curable resin composition (Y) together with the substrate are peeled off from the surface of the mold, so that an product having an uneven microstructure, which corresponds to the uneven microstructure of the mold, on the surface thereof is obtained.

Herein, "an active energy ray curable resin composition for shaping different from the active energy ray curable resin composition for the mold surface release treatment" refers to an active energy ray curable resin composition having at least one of the components thereof or at least one of the compositional ratio of the components being different, and means that the above composition is used for shaping the product having the surface with the uneven microstructure thereon, when compared with the active energy ray curable resin composition for the mold surface release treatment in Step (I).

Figure 2:
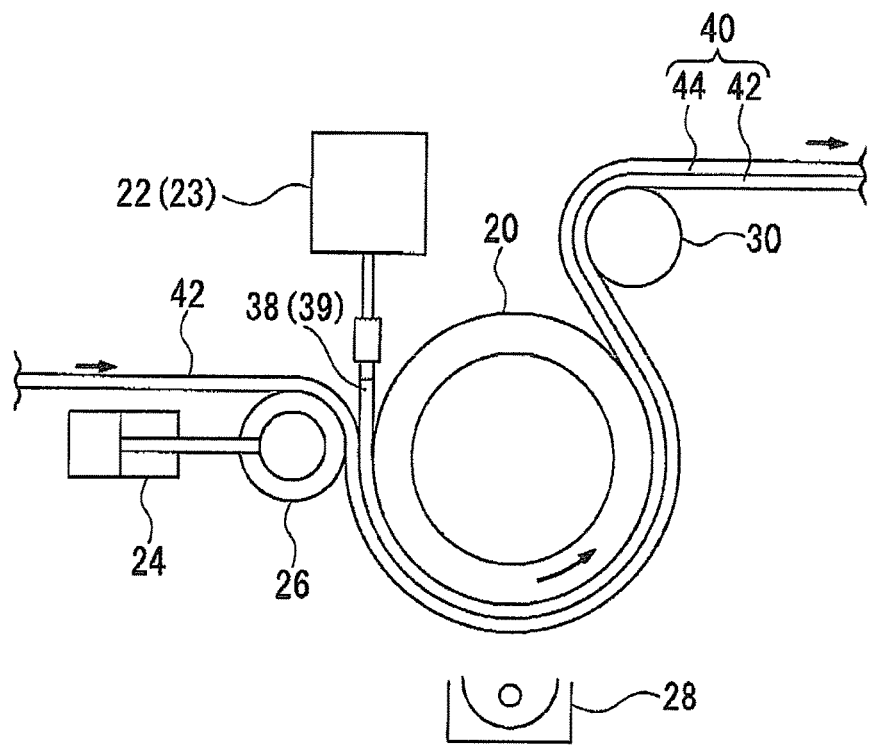
FIG. 2 is a block diagram showing an example of a manufacturing apparatus for a product having an uneven microstructure on a surface thereof.

Step (I):

As shown in FIG. 2, from the tank 22, the active energy ray curable resin composition (X) 38 is supplied between the roll mold 20 having the uneven microstructure (not shown) thereon and the strip film (substrate) 42 that moves along the surface of the mold 20 in synchronism with the rotation of the mold 20.

Between the roll mold 20 and the nip rolls 26, the active energy ray curable resin composition (X) 38 and the film 42 are nipped with a nip pressure adjusted by the pneumatic cylinder 24, so that the active energy ray curable resin composition (X) 38 is distributed uniformly over the film 42 and the mold 20 and at the same time is filled into the pores of the uneven microstructure of the mold 20.

From the active energy ray irradiation device 28, which is disposed below the mold 20, the active energy ray is irradiated to the active energy ray curable resin composition (X) 38 through the film 42 to cure the active energy ray curable resin composition (X) 38, so as to form a cured resin layer 44 that is transferred with the uneven microstructure on the surface of the mold 20.

The film 42 with the cured resin layer 44 formed thereon is peeled off from the mold 20 by the peeling roll 30, thus performing the release treatment to the surface of the mold 20.

Step (II):

From the tank 23 disposed adjacent to the tank 22, the active energy ray curable resin composition (Y) 39 is supplied between the roll mold 20 that has been treated with the release treatment in Step (I) and the strip film (substrate) 42 that moves along the surface of the mold 20 in synchronism with the rotation of the mold 20.

Between the roll mold 20 and the nip rolls 26, the active energy ray curable resin composition (Y) 39 and the film 42 are nipped with a nip pressure adjusted by the pneumatic cylinder 24, so that the active energy ray curable resin composition (Y) 39 is distributed uniformly over the film 42 and the mold 20 and at the same time is filled into the pores of the uneven microstructure of the mold 20.

From the active energy ray irradiation device 28, which is disposed below the mold 20, the active energy ray is irradiated to the active energy ray curable resin composition (Y) 39 through the film 42 to cure the active energy ray curable resin composition (Y) 39, so as to form a cured resin layer 44 that is transferred with the uneven microstructure on the surface of the mold 20.

Figure 3:
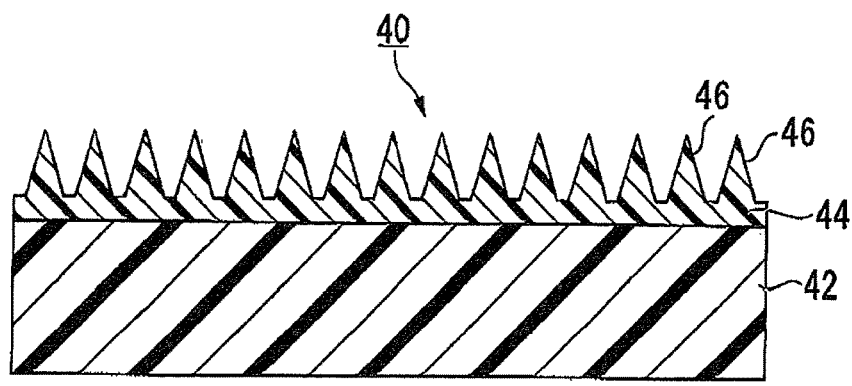
FIG. 3 is a schematic cross-sectional view showing an example of the product having the uneven microstructure on the surface thereof.

The film 42 with the cured resin layer 44 formed thereon is peeled off from the mold 20 by the peeling roll 30, so as to obtain the product as shown in FIG. 3.

The active energy ray irradiation device 28 may preferably be a high-pressure mercury lamp, a metal halide lamp, the fusion lamp, and the like. The irradiation energy in this case is preferably 100-10000 mJ/cm$^2$.

(Active Energy Ray)

As for the active energy ray, ultraviolet light is preferred. Examples of the ultraviolet irradiation lamp may be exemplified as the chemical lamp, high pressure mercury lamp, metal halide lamp, UV lamp without electrodes (manufactured by Fusion UV Systems, Inc.) and the like. In addition, it may be used in combination with heat curing.

The irradiation amount of ultraviolet light may be determined according to the absorption wavelength and the content of an active energy ray polymerization initiator (B). The accumulated irradiation energy of UV light is 100-10000 mJ/cm$^2$, preferably 100-8000 mJ/cm$^2$, and more preferably 400-6000 MJ/cm$^2$. When the accumulated irradiation energy of UV light is 100 mJ/cm$^2$ or more, the active energy ray curable resin composition (Y) can be cured sufficiently. When the accumulated irradiation energy of UV light is 10000 mJ/cm$^2$ or less, it is possible to suppress the degradation of the substrate. Ultraviolet irradiation intensity may preferably be suppressed to an output level that does not cause the deterioration of the substrate.

(Substrate)

As for the substrate, the same material of the substrate used in the mold release treatment method may be used for the substrate.

The method for producing a product having the uneven microstructure thereon of the invention may further include the step of treating the mold using an external release agent before the Step (I).

The step of treating the mold with the external release agent is first forming the uneven microstructure on the surface of the mold substrate to fabricate the mold by using the aforementioned method.

Then, using the external release agent to treat the surface of the mold at the side of the mold where the uneven microstructure is formed.

The external release agent preferably is a release agent having the functional group that forms a chemical bonding with the anodized alumina on the aluminum substrate. Strictly speaking, the external release agent is used to treat the surface of the uneven microstructure of the mold having the uneven microstructure formed on the surface thereof, hereinafter it may be simply described as treating "the mold having the uneven microstructure formed on the surface thereof" or "the mold surface".

The external release agent may be exemplified as silicone resins, fluorine resins, fluoro-compounds, and the like. The fluoro-compound having a hydrolyzable silyl group is particularly preferred. The commercially available fluoro-compound having a hydrolyzable silyl group may be exemplified as fluoroalkyl silane, KBM-7803 (Manufactured by Shin-Etsu Chemical Co., Ltd.), MRAF (manufactured by Asahi Glass Company, Limited), OPTOOL HD1100, HD2100 series (manufactured by Harves Company), OPTOOL DSX, OPTOOL AES6, OPTOOL AES4 (manufactured by Daikin Industries, Ltd.), Novec EGC-1720 (manufactured by Sumitomo 3M), FS-2050 series (manufactured by Fluoro Technology), and the like.

The treatment method using the external release agent may be exemplified as the following methods (i-1) and (i-2). In the viewpoint of uniformly treating the surface of the mold, on which the uneven microstructure is formed, with the external release agent, the method (i-1) is particularly preferred.

Method (i-1) is a method of immersing the mold body in a dilute solution of the external release agent.

Method (i-2) is a method of coating the external release agent or a dilute solution thereof to the mold surface with the uneven microstructure formed thereon.

Method (i-1) is preferably the method having following steps (g)-(l).

Step (g) washing the mold with water.

Step (h), after Step (g), removing the water attached to the surface of the mold by blowing air into the mold.

Step (i) immersing the mold into the dilute solution that is obtained by diluting the fluoro-compound having a hydrolyzable silyl group with a fluorine-based solvent.

Step (j) pulling out the immersed mold from the solution slowly.

Step (k), if needed, heating and humidifying the mold in the later stage relative to Step (j).

Step (l) drying the mold body.

Step (g):

The agents used for forming the uneven microstructure (such as the aqueous solution of phosphoric acid used in the pore diameter-expanding treatment) and impurities (such as dust etc.) attached to the mold are removed by water washing.

Step (h):

Blowing air into the mold, so as to remove almost all water droplets visible to the naked eye.

Step (i):

The fluorine-based solvent for dilution may be exemplified as hydrofluoropolyether, perfluorohexane, perfluoro methyl cyclohexane, perfluoro-1,3-dimethyl cyclohexane, dichloropentafluoropropane and the like.

In the dilute solution (100 mass %), the concentration of the fluoro-compound having a hydrolyzable silyl group ranges preferably from 0.01 mass % to 0.5 mass %.

The immersion time is preferably 1-30 minutes.

The immersion temperature is preferably 0-50° C.

Step (j):

When pulling out the immersed mold from the solution, it is preferred to use an electric pulling device, for pulling out at a constant speed to reduce swing during pulling. By doing so, the uneven coating can be reduced.

The pulling out speed is preferably 1 mm/sec-10 mm/sec.

Step (k):

In the latter stage to Step (j), the mold may be heated and humidified. By leaving the mold under humidifying and heating, the hydrolyzable silyl group of the fluoro-compound (release agent) is hydrolyzed to generate a silanol group. The reaction of the silanol groups with the hydroxyl groups on the surface of the mold proceeds sufficiently, and the fixing property of the fluoro-compound is improved. As for the humidifying method, the saturated salt method using a saturated salt solution, the humidifying method by heating the water, the method of spraying the heated water vapor directly into the mold, and the like may be considered. Such a step may be carried out in a thermo-hygrostat.

The heating temperature, 30-150° C. is preferred.

The humidity conditions, equal to or more than 60% relative humidity is preferred.

The standing time is preferably 10 minutes to 7 days.

Step (l):

In the step of drying the mold, the mold may be air dried or compulsorily dried by heating in the dryer.

The drying temperature is preferably 30-150° C.

The drying time is preferably 5-300 minutes.

Whether the surface of the mold has been treated with the external release agent can be confirmed by measuring the water contact angle of the surface of the mold. The water contact angle of the surface of the mold that has been treated with the external release agent is preferably equal to or larger than 60°, more preferably equal to or larger than 90°. If the water contact angle is equal to or larger than 60°, the mold surface is well treated with the external release agent, and the releasability between the cured resin layer and the mold is good.

By treating the surface of the mold on which the uneven microstructure with the external release agent is formed, the preferable releasability is achieved at the early stage of transferring the uneven microstructure of the mold to the surface of the product. Furthermore, even under repetitively transfer, the releasability is hard to decline. Hence, the product having the surface with the uneven microstructure thereon can be produced with high productivity.

In case that the method for producing the product having the uneven microstructure thereon of the invention includes treating the mold with the external release agent before the Step (I), the active energy ray curable resin composition for the mold surface release treatment (X) (sometimes called the first curable resin) that contains an internal release agent is inserted in Step (I) between the mold and the substrate and cured to form the cured resin layer transferred with the uneven microstructure on the substrate surface. At this time, a portion of the internal release agent is transited to the mold surface.

By performing the Step (I), the extraneous substance adhering to the region of the uneven microstructure of the mold is removed from the mold and attached to the first curable resin. At the same time, since the mold parts (including the portions adhered with the extraneous substances) that have been insufficiently treated by the external release agent are coated with the internal release agent that has been transited from the first curable resin, the region of the uneven microstructures of the mold can be processed with a release agent uniformly and sufficiently. Moreover, because the first curable resin contains the internal release agent, the first curable resin is unlikely to cause resin residue on the surface of the mold.

The shape of the substrate may be exemplified as a film, a sheet, injection molded products and press molded products and the like.

Examples of the material of the substrate may be polycarbonate, polystyrene resin, polyester, acrylic resin, cellulose resin (triacetyl cellulose, etc.), polyolefins, glass and the like.

The first curable resin may be exemplified as the following active energy ray curable resin composition added with an internal release agent. That is, the first curable resin may be exemplified as a composition including a polymerizable compound, a polymerization initiator and an internal release agent.

From the viewpoint that the extraneous substance on the surface of the mold is likely to adhere, it is preferable to use an active energy ray curable resin composition capable of forming the hydrophilic material in the following active energy ray curable resin composition, as a first curable resin.

The first curable resin is preferably a resin that is irradiated with an active energy ray of the accumulated energy of 1000 mJ/cm$^2$ to form the cured article has an indentation elastic modulus of 5-2000 MPa at 23° C. When the indentation elastic modulus of the cured article at 23° C. is 5 MPa or more, the cured article is not fractured during the mold release and does not have residue left on the surface of the mold. Further, when the indentation elastic modulus of the cured article at 23° C. is equal to or less than 2000 MPa, the uneven microstructure of the cured article becomes less brittle, and the cured article is not broken during releasing the mold coated with the external release agent and does not have residue left on the surface of the mold. More preferably, if the indentation elastic modulus is equal to or more than 1000 MPa, the residual cured article left on the surface of the mold can be more strictly suppressed.

Ultra-microhardness test system (manufactured by Fischer, Fischer Scope HM2000) is used to measure the indentation elastic modulus of the cured product.

The internal release agent may be selected from the compounds that migrate from the first curable resin to the mold surface to improve the releasability between the mold and the cured article of the curable resin.

The internal release agent may be fluorine-containing compounds, silicone compounds, phosphate ester compounds, compounds having a long-chain alkyl group, solid wax (polyethylene wax, amide wax, polytetrafluoroethylene powders), and the like.

Moreover, from the viewpoint of good releasability to the mold, the internal release agent is preferably a release agent different from the external release agent.

From the viewpoint of good releasability between the cured article of the first curable resin and the mold, the internal release agent preferably contains the (poly)oxyalkylene alkyl phosphate ester compounds.

From the viewpoint of releasability, the (poly)oxyalkylene alkyl phosphate ester compounds represented by the following formula (1) are preferred.

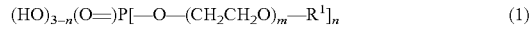

$$(HO)_{3-n}(O=)P[-O-(CH_2CH_2O)_m-R^1]_n \qquad (1)$$

$R^1$ is an alkyl group, m is an integer of 1-20, n is an integer of 1-3.

$R^1$ is an alkyl group having 1-20 carbon atoms, more preferably an alkyl group having 3-18 carbon atoms.

m is preferably an integer of 1-10.

(Poly)oxyalkylene alkyl phosphate ester compounds may be monoesters (n=1), diesters (n=2), or triesters (n=3). In the case of being the diester or triester, the plurality of (poly)oxyalkylene alkyl groups in one molecule may be different.

Examples of commercial products of the (poly)oxyalkylene alkyl phosphate ester compounds may be exemplified as the followings.

manufactured by Johoku Chemical Co.: JP-506H, manufactured by Axel Co.: Mold Uiz INT-1856, manufactured by Nikko Chemicals Co.: TDP-10, TDP-8, TDP-6, TDP-2, DDP-10, DDP-8, DDP-6, DDP-4, DDP-2, TLP-4, TCP-5, DLP-10.

The (poly)oxyalkylene alkyl phosphate ester compounds may be used as a single kind or a combination of two or more kinds.

Relative to 100 parts by mass of the polymerizable compound, the amount of (poly)oxyalkylene alkyl phosphate ester compounds is preferably 0.01 to 1 part by mass, more preferably 0.05 to 0.5 parts by mass, even more preferably 0.05 to 0.1 parts by mass. When the amount of (poly)oxyalkylene alkyl phosphate ester compounds is equal to or less than 1 part by mass, the extraneous substance on the mold surface can be fully removed. The reduction of the adhesion to the substrate can be suppressed. As a result, the residue of the resin on the mold can be suppressed. When the amount of (poly)oxyalkylene alkyl phosphate ester compounds is equal to or more than 0.01 parts by mass, as enough amount of (poly)oxyalkylene alkyl phosphate ester compound is transited from the mold surface, the releasability from the mold is sufficient and the residue of the resin on the mold can be suppressed.

In case that the method for producing the product having the uneven microstructure thereon of the invention further includes treating the mold with the external release agent before the Step (I), in Step (II), the active energy ray curable resin composition for shaping (Y) (sometimes called the second curable resin) is inserted between the mold and the substrate and cured to form the cured resin layer transferred with the uneven microstructure on the substrate surface, thus obtaining the product having the uneven microstructure on the surface thereof.

The shape of the substrate may be exemplified as a film, a sheet, injection molded products and press molded products and the like.

Examples of the material of the substrate may be polycarbonate, polystyrene resin, polyester, acrylic resin, cellulose resin (triacetyl cellulose, etc.), polyolefins, glass and the like.

The second curable resin may be exemplified as the following active energy ray curable resin composition. The second curable resin may be exemplified as a composition including a polymerizable compound and a polymerization initiator. In case that the second curable resin contains an internal release agent, it is preferable that the type and/or the amount of the release agent in the second curable resin are different from those of external release agent. For the product having the surface uneven microstructure produced by curing the second curable resin, appropriate curable resin capable of forming the hydrophobic or hydrophilic material may be used depending on the application the product. In addition, as the mechanical strength of the cured article is insufficient, even a curable resin, of which the cured article could be broken during the mold release and results in the residual resin, can be used as the second curable resin. For examples, a curable resin, of which the cured article having the indentation elastic modulus at 23° C. greater than 2000 Mpa, may be used as the second curable resin.

From the viewpoint that the resin residue on the mold is difficult to occur, it is more preferable to use an active energy ray curable resin composition capable of forming the hydrophobic material in the following active energy ray curable resin compositions as the second curable resin.

The polymerizable compound may be exemplified as the polymerizable compound to be described later.

The polymerization initiator may be exemplified as the polymerization initiator to be described later.

If needed, the second curable resin may contain the internal release agent.

The supply line and the tank 23 for supplying the second curable resin 39 in the Step (II) and the supply line and the tank 22 for supplying the first curable resin 38 in the Step (II) may be the same or different. From the viewpoint of without washing during switching the resin(s), it is preferable to be separate tanks and lines. Further, when proceeding to the Step (II) from the Step (I), the movement of the film and the rotation of the mold may be paused temporarily, alternatively the movement of the film and the rotation of the mold may proceed without stop for the purpose of such as improving productivity.

(Products)

FIG. 3 is a schematic cross-sectional view showing an example of the product 40 having the uneven microstructure on the surface thereof.

The product 40 obtained through the above method(s) is a product of the cured resin layer 44 having the uneven microstructure (the reversal structure), which is transferred from the uneven microstructure of the mold in a key-and-keyhole relationship, formed on the surface of the film (substrate) 42.

The film 42 is a light transparent film. The material of the film 42 may be exemplified as polycarbonate, polystyrene resin, polyester, polyurethane, acrylic resin, polyethersulfone, polysulfones, polyether ketone, cellulose resin (triacetyl cellulose, etc.), polyolefins, alicyclic polyolefins and the like.

The cured resin layer 44 is a film including a cured article of the active energy ray curable resin composition (Y) 39, having uneven microstructures on the surface.

When using a mold of anodized alumina, the uneven microstructure on the surface of the product 40, which has been formed by transferring the uneven microstructure on the surface of anodized alumina, includes a plurality of protrusions 46 (convex) formed of the cured article of the active energy ray curable resin composition (Y) 39.

As the uneven microstructure, the so-called moth-eye structure with a plurality of protrusions of substantially conical or pyramid shape arranged as multi-lined is preferred. The moth-eye structure with the interval between the protrusions equal to or less than the wavelength of visible light is known to be an effective means for antireflection because the refractive indices are increased continuously from the refractive index of air to the refractive index of the material.

The average interval between the protrusions is equal to or less than the wavelength of visible light, i.e. equal to or less than 400 nm. If the protrusion is formed by using a mold of anodized alumina, as the average interval between the protrusions is about 100 to 200 nm, equal to or less than 250 nm is particularly preferred.

From the viewpoint of simple construction of the protrusions, the average interval between the protrusions is preferably equal to or more than 20 nm.

The average interval between the protrusions is to measure 10 or 50 values of the interval (the distance from the center of one protrusion to the center of the adjacent protrusion) between adjacent protrusions by electron microscope, and then take the average of these values.

When the average interval is 100 nm, the height of the protrusions is preferably 80-500 nm, more preferably 120-400 nm, and particularly preferably 150-300 nm. If the height of the protrusions is equal to or more than 80 nm, the reflectivity becomes sufficiently low and the wavelength dependence of reflectivity is small. If the height of the protrusions is equal to or less than 500 nm, scratch resistance of the protrusion can be improved.

The height of the protrusions is obtained by measuring the distance between the top part of the convex portion and the bottom of the concave portion between the protrusions when observed at a magnification of 30,000 by electron microscope.

The aspect ratio (the height of the protrusion/the average interval between the protrusions) of the protrusions is preferably 0.8-5.0, more preferably 1.2-4.0, and particularly preferably 1.5-3.0. When the aspect ratio is equal to or more than 0.8, the reflectivity becomes sufficiently low and the wavelength dependence of reflectivity is small. When the aspect ratio of the protrusion is equal to or less than 5.0, the abrasion resistance of the protrusions can be improved.

The height of the protrusions is obtained by measuring the distance between the top part of the convex portion and the bottom of the concave portion between the protrusions when observed at a magnification of 30,000 by electron microscope.

For the shape of the protrusions, the cross-sectional area that is perpendicular to the depth direction continuously increases from the top toward the depth direction, and the preferred shape of the cross-sections of the protrusions in the height direction may be a triangular shape, a trapezoid, a bell shape, and the like.

The difference between the refractive index of the cured resin layer 44 and the refractive index of the film 42 is preferably equal to or less than 0.2, more preferably equal to or less than 0.1, particularly preferably equal to or less than 0.05. When the refractive index difference is equal to or less than 0.2, the reflection at the interface between the cured resin layer 44 and the film 42 can be suppressed.

In the case of having the uneven microstructure on the surface, super water repellency over the surface can be obtained due to the lotus effect if it is made of a hydrophobic material. Similarly, super hydrophilicity can be obtained over the surface if it is made of hydrophilic material.

When the material of the cured resin layer 44 is a hydrophobic material, the water contact angle at the surface of the uneven microstructure is preferably equal to or larger than 90°, more preferably equal to or larger than 110° and particularly preferably equal to or larger than 120°. If the water contact angle is equal to or larger than 90°, the water stain is unlikely to be attached and the stain-proof property is sufficiently presented. In addition, as the water is unlikely to be attached, it is expected to prevent ice-up.

When the material of the cured resin layer 44 is a hydrophilic material, the water contact angle at the surface of the uneven microstructure is preferably equal to or less than 25°, more preferably equal to or less than 23° and particularly preferably equal to or less than 21°. If the water contact angle is equal to or less than 25°, the stain may be easily washed by water and is unlikely to have oil stains attached, so that the stain-proof property is sufficiently presented. In view of the deformation of the uneven microstructure and the increased reflectivity as a result of water absorption by the cured resin layer 44, the water contact angle is preferably equal to or larger than 3°.

(Uses)

The uses of the product 40 may be exemplified as antireflection products, anti-fog products, stain-proof products, water-repellent products. Specifically, the product may be exemplified as the antireflection film for the displays, the meter cover of automobiles, the mirror of automobiles, the window of automobiles, emission enhancing elements for organic or inorganic electroluminescent, solar cell members and the like.

In the case of using the product having the surface uneven microstructure as an antireflection film, the product having the surface uneven microstructure is adhered to the surface of the objects such as image display devices (liquid crystal display devices, plasma display panels, electroluminescent displays, cathode tube display devices, etc.), lens, show windows, eyeglass lens and the like.

If the portion that the product having the surface uneven microstructure is to be adhered is of a three-dimensional shape, a substrate in a shape corresponding to the portion is used in advance to fabricate the product having the surface uneven microstructure, which is adhered to the surface of the predetermined portion of the object.

Further, not only on its surface, if the object is an image display device, the product having the surface uneven microstructure may be affixed on the surface of the front plate of the image display device, or the front panel itself may be made from the product having the surface uneven microstructure.

In addition to the applications described above, for example, the product having the surface uneven microstructure may be used for optical applications such as an optical waveguide, a relief hologram, a solar cell, a lens, a polarization separation element, light extraction enhancing member for organic electroluminescence and the like or as cell culture sheets.

Moreover, since the product having the surface uneven microstructure shows the lotus effect, the product having the surface uneven microstructure can also be used as anti-fog products, stain-proof products, and water-repellent products.

(Effects)

In the method of producing the product of the invention described above, since a mold that has the surface treated by the release treatment method of the invention and has the uneven microstructure on the surface thereof is employed, the product having the surface uneven microstructure, which is transferred accurately with the uneven microstructure of the mold and has the uneven microstructure with suppressed surface contamination caused by the release agent, can be fabricated with high productivity.

The method for producing the product having the uneven microstructure thereon of the invention may further include treating the mold with the external release agent before the Step (I). As the step of treating the mold having the surface uneven microstructure with the external release agent and the Step (I) of inserting the first curable resin that contains the internal release agent between the mold and the substrate for a portion of the internal release agent transiting to the mold surface are included, the whole region of the uneven microstructure of the mold can be uniformly and sufficiently treated with the release agent. Therefore, after Step (I), the defects in the uneven microstructure transferred from the mold can be suppressed for Step (II) of inserting the second curable resin between the mold and the substrate, curing to form the cured resin layer transferred with the uneven microstructure on the substrate surface, and obtaining the product having the uneven microstructure on the surface thereof.

In addition, by using a roll mold as the mold and a strip substrate that moves along the surface of the roll mold in synchronism with the rotation of the roll mold as the substrate, the substrate is moved along the surface of the roll mold, while Step (II), following Step (I), is performed continuously. The product having the surface uneven microstructure, which is transferred accurately with the uneven microstructure of the mold and has the uneven microstructure with suppressed surface contamination caused by the release agent, can be fabricated with high productivity.

For the method for producing the product having the surface uneven microstructure of the invention, which includes the Steps (I)-(II), the active energy ray curable resin composition for the mold surface release treatment preferably includes a polymerizable compound (A), an active energy ray polymerization initiator (B) and a release agent (C), and is cured by irradiation with an active energy ray of the accumulated light energy of 1000 mJ/cm$^2$ and the indentation elastic modulus of the cured article of the active energy ray curable resin composition is 5-1000 MPa at 23° C.

For the method for producing a product having the surface uneven microstructure of the invention, which further includes treating the mold with the external release agent before the Step (I), the active energy ray curable resin composition for the mold surface release treatment includes a polymerizable compound (A), an active energy ray polymerization initiator (B) and a release agent (C), and is cured by irradiation with an active energy ray of the accumulated light energy of 1000 mJ/cm2 and the indentation elastic modulus of the cured article of the active energy ray curable resin composition is 5-2000 MPa at 23° C.

<Active Energy Ray Curable Resin Composition for the Mold Surface Release Treatment>

The active energy ray curable resin composition for the mold surface release treatment (also referred as the active energy ray curable resin composition (X) in the specification) used in the producing method of the product having the surface uneven microstructure of the invention is an active energy ray curable resin composition for treating the surface of the mold having the uneven microstructure thereon, which includes a polymerizable compound (A), an active energy ray polymerization initiator (B) and a release agent (C).

The active energy ray curable resin composition (X) is a resin that is irradiated with an active energy ray of the accumulated energy of 1000 mJ/cm$^2$ to form the cured article has an indentation elastic modulus of 5-2000 MPa at 23° C. When the indentation elastic modulus of the cured product at 23° C. is 5 MPa or more, the cured article is not fractured during the mold release and does not have residue left on the surface of the mold. Further, when the indentation elastic modulus of the cured article at 23° C. is equal to or less than 1000 MPa, the uneven microstructure of the cured article becomes less brittle, and the cured article is not broken during releasing the mold coated with the external release agent and does not have residue left on the surface of the mold. For the producing method of the product having the surface uneven microstructure of the invention further includes treating the mold with the external release agent before the Step (I), the active energy ray curable resin composition (X) of the indentation elastic modulus 5-2000 MPa at 23° C. may be used.

Ultra-microhardness test system (manufactured by Fischer, Fischer Scope HM2000) is used to measure the indentation elastic modulus of the cured article.

From the viewpoint of fully supplying the active energy ray curable resin composition (X) to the fine parts of the uneven microstructure of the mold, the viscosity of the active energy ray curable resin composition (X) measured by a rotary B-type viscometer at 25° C. is preferably equal to or less than 10 Pa·s, more preferably equal to or less than 5 Pa·s, particularly preferably equal to or less than 2 Pa·s. In addition, preheating may be performed to reduce the viscosity when supplied to the mold surface.

(Polymerizable Compounds (A))

Polymerizable compounds (A) may be exemplified as the molecules of monomers, oligomers or reactive polymers having free radical polymerization bond(s) and/or cationic polymerization bond(s), etc. The (meth)acrylate polymers having the acrylyloxy groups or (meth)acrylyloxy groups are preferred.

Examples of the monomer having a free radical polymerization bond may be a monofunctional monomer or a polyfunctional monomer.

The monofunctional monomer includes alkyl(meth)acrylate derivatives such as methyl(meth)acrylate, ethyl(meth)acrylate, propyl(meth)acrylate, n-butyl(meth)acrylate, i-butyl(meth)acrylate, s-butyl(meth)acrylate, t-butyl(meth)acrylate, 2-ethylhexyl(meth)acrylate, lauryl(meth)acrylate, tridecyl(meth)acrylate, stearyl(meth)acrylate and the like; (meth)acrylate derivatives such as, cyclohexyl(meth)acrylate, benzyl(meth)acrylate, phenoxyethyl(meth)acrylate, isobornyl(meth)acrylate, glycidyl(meth)acrylate, tetrahydrofurfuryl(meth)acrylate, allyl(meth)acrylate, 2-hydroxyethyl(meth)acrylate, hydroxypropyl(meth)acrylate, 2-methoxyethyl(meth)acrylate, 2-ethoxyethyl(meth)acrylate and the like; (meth)acrylic acid, (meth)acrylonitrile; styrene derivatives such as styrene, α-methyl styrene; (meth)acrylamide derivatives such as (meth)acrylamide, N,N-dimethyl (meth)acrylamide, N,N-diethyl(meth)acrylamide, dimethylaminopropyl(meth)acrylamide and the like.

These compounds may be used in a combination of two or more kinds or may be used singly.

The polyfunctional monomers include bifunctional monomers such as ethylene glycol di(meth)acrylate, tripropylene glycol di(meth)acrylate, isocyanuric acid ethylene oxide modified di(meth)acrylate, triethylene glycol di(meth)acrylate, diethylene glycol di(meth)acrylate, neopentyl glycol di(meth)acrylate, 1,6-hexanediol di(meth)acrylate, 1,5-pentanediol di(meth)acrylate, 1,3-butylene glycol di(meth)acrylate, polybutylene glycol di(meth)acrylate, 2,2-bis(4-(meth)acryloxypolyethoxyphenyl)propane, 2,2-bis(4-(meth)acryloxyethoxyphenyl)propane, 2,2-bis(4-(3-(meth)acryloxy-2-hydroxypropoxy)phenyl)propane, 1,2-bis(3-(meth)acryloxy-2-hydroxypropoxy)ethane, 1,4-bis(3-(meth)acryloxy-2-hydroxypropoxy)butane, dimethylol tricyclodecane di(meth)acrylate, bisphenol A ethylene oxide adduct di(meth)acrylate, bisphenol A propylene oxide adduct di(meth)acrylate, hydroxypivalic acid neopentyl glycol di(meth)acrylate, divinylbenzene, methylenebisacrylamide and the like; tri-functional monomers such as pentaerythritol tri(meth)acrylate, trimethylolpropane tri(meth)acrylate, trimethylolpropane ethylene oxide modified tri(meth)acrylate, trimethylolpropane propylene oxide modified triacrylate, trimethylolpropane ethylene oxide modified triacrylate, isocyanuric acid ethylene oxide modified tri(meth)acrylate and the like; tetra-functional monomers such as condensation reaction mixture of succinic acid/trimethylolethane/acrylic acid, di pentaerythritol hexa(meth)acrylate, di pentaerythritol penta(meth)acrylate, ditrimethylolpropane tetraacrylate, tetramethylolmethane tetra(meth)acrylate and the like; urethane acrylate of two or more functional groups, polyester acrylate of two or more functional groups, and the like. These compounds may be used in a combination of two or more kinds or may be used singly.

Examples of the monomers having a cationic polymerization bond may be the monomers having an epoxy group, an oxetanyl group, an oxazolyl group, a vinyloxy group and the like. The monomer having an epoxy group is particularly preferable.

Oligomers or reactive polymers may be exemplified as unsaturated polyesters such as condensation products of polyhydric alcohol and unsaturated dicarboxylic acid; polyester(meth)acrylates, polyether(meth)acrylate, polyol(meth) acrylate, epoxy(meth)acrylate, urethane(meth)acrylates, cationic polymerizable epoxy compounds, homopolymers or copolymers of the above-described monomers having a free radical polymerization bond at the side chains, and the like.

(Polymerization Initiator (B))

The polymerization initiator (B) is a compound to generate free radicals or cationic ions by irradiating with an active energy ray. From the viewpoint of equipment costs and productivity, the photo-polymerization initiator using ultraviolet light as the active energy ray is preferably used.

When using the photocuring reaction, examples of the photo-polymerization initiators include carbonyl compounds, such as benzoin, benzoin methyl ether, benzoin ethyl ether, benzoin isopropyl ether, benzoin isobutyl ether, benzil, benzophenone, p-methoxy-benzophenone, 2,2-diethoxyacetophenone, α,α-dimethoxy-α-phenyl acetophenone, methylphenyl glyoxylate, ethylphenyl glyoxylate, 4,4'-bis(dimethylamino)benzophenone, 2-hydroxy-2-methyl-1-phenylpropan-1-one and the like; sulfur compounds such as tetramethyl thiuram monosulfide, tetramethyl thiuram disulfide and the like; 2,4,6-trimethyl benzoyl diphenyl phosphine oxide, benzoyl diethoxy phosphine oxide and the like. These compounds may be used in a combination of two or more kinds or may be used singly.

When using electron beam curing reaction, examples of the polymerization initiators include thioxanthone such as benzophenone, 4,4-bis(diethylamino)benzophenone, 2,4,6-trimethyl benzophenone, methyl o-benzoyl benzoate, 4-phenyl-benzophenone, t-butyl anthraquinone, 2-ethyl anthraquinone, 2,4-diethyl thioxanthone, isopropylthioxanthone, 2,4-dichloro thioxanthone and the like; acetophenone such as diethoxyacetophenone, 2-hydroxy-2-methyl-1-phenyl-propan-1-one, benzyl dimethyl ketal, 1-hydroxycyclohexyl-phenyl ketone, 2-methyl-2-morpholino-(4-thiomethylphe-nyl)propan-1-one, 2-benzyl-2-dimethylamino-1-(4-morpholinophenyl)-butanone and the like; benzoin ethers such as, benzoin methyl ether, benzoin ethyl ether, benzoin isopropyl ether, benzoin isobutyl ether, etc.; acyl phosphine oxides such as, 2,4,6-trimethyl benzoyl diphenyl phosphine oxide, bis (2,6-dimethoxyphenyl)-2,4,4-trimethyl pentyl phosphine oxide, bis(2,4,6-tri-methyl-benzoyl)phenyl phosphine oxide and the like; methyl benzoyl formate, 1,7-bis acridinyl heptane, 9-phenyl acridine and the like. These compounds may be used in a combination of two or more kinds or may be used singly.

When using a thermal curing reaction, examples of a thermal polymerization initiator include the organic peroxides such as methyl ethyl ketone peroxide, benzoyl peroxide, dicumyl peroxide, t-butyl hydroperoxide, cumene hydroperoxide, t-butyl peroxy octoate organic peroxide t-butyl peroxybenzoate, lauroyl peroxide and the like; azo compounds such as azobisisobutyronitrile and the like; a redox polymerization initiator such as a combination of amine such as N,N-dimethyl aniline, N,N-dimethyl p-toluidine, etc. with the above organic peroxides.

Relative to 100 parts by mass of the polymerizable compound (A), the amount of the polymerization initiator (B) is preferably 0.1-10 parts by mass. When the amount of the polymerization initiator is less than 0.1 part by mass, the polymerization is difficult to proceed. If the amount of the polymerization initiator exceeds 10 parts by mass, the cured film may be colored or the mechanical strength is lowered.

(Release Agent (C))

The release agent (C) may be exemplified as fluorine-containing compounds, silicone compounds, phosphate ester compounds, compounds having a long-chain alkyl group, solid wax (polyethylene wax, amide wax, polytetrafluoroethylene powders), and the like.

Concerning that the releasability between the mold and the cured article of the active energy ray curable resin composition (X) becomes good, the release load is very low, and less damage occurs to the uneven microstructure, (poly)oxyalkylene alkyl phosphate ester compounds are preferred as the release agent (C).

From the viewpoint of releasability, the (poly)oxyalkylene alkyl phosphate ester compounds represented by the following formula (1) are preferred.

[Formula 1]

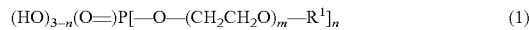

$(HO)_{3-n}(O=)P[-O-(CH_2CH_2O)_m-R^1]_n$ (1)

$R^1$ is an alkyl group, m is an integer of 1-20, n is an integer of 1-3.

$R^1$ is preferably an alkyl group having 3-18 carbon atoms.
m is preferably an integer of 1-10.

(Poly)oxyalkylene alkyl phosphate ester compounds may be monoesters (n=1), diesters (n=2), or triesters (n=3). In the case of being the diester or triester, the plurality of polyoxyalkylene alkyl groups in one molecule may be different.

Examples of commercial products of the (poly)oxyalkylene alkyl phosphate ester compounds may be exemplified as the followings.

manufactured by Johoku Chemical Co.: JP-506H,
manufactured by Axel Co.: Mold Uiz series (registered trademark) INT-1856,
manufactured by Nikko Chemicals Co.: TDP-10, TDP-8, TDP-6, TDP-2, DDP-10, DDP-8, DDP-6, DDP-4, DDP-2, TLP-4, TCP-5, DLP-10.

The (poly)oxyalkylene alkyl phosphate ester compounds may be used as a single kind or a combination of two or more kinds.

Relative to 100 parts by mass of the polymerizable compound, the amount of the release agent in the general active energy ray curable resin composition is about 0.1 parts by mass. However, relative to 100 parts by mass of the polymerizable compound (A), the amount of the release agent (C) of the invention is preferably equal to or less than 10 parts by mass, more preferably 0.05-5 parts by mass, even more preferably 0.5-3 parts by mass. When the external release agent is not used, 0.3 parts by mass or more is preferred. If the amount of the release agent (C) is equal to or more than 0.3 parts by mass, excellent releasability can be imparted to the mold surface. If the amount of the release agent (C) is 10 parts by mass or less, the release agent adhered to the surface of the mold will not be too much, when using a common active energy ray curable resin composition for shaping to transfer the uneven microstructure of the mold to the surface of the substrate, and there is no unevenness or poor appearance generated on the surface of the manufactured product.

(Other Additives)

The active energy ray curable resin composition (X) may include, if necessary, common additives such as antioxidants, ultraviolet absorbers, light stabilizers, leveling agents, heat stabilizers, plasticizers, an antistatic agent, flame retardant additives, flame retardant aid, polymerization inhibitors, fillers, silane coupling agents, colorants, reinforcing agents, inorganic fillers, and impact modifiers.

(Active Energy Ray Curable Resin Composition for Shaping)

The active energy ray curable resin composition (Y) may be exemplified as a composition including polymerizable compound (A) and active energy ray polymerization initiator (B) as the required components and optionally including the release agent (C) or other additives.

As for the polymerizable compound (A), the same polymerizable compound used in the active energy ray curable resin composition (X) may be used.

As for the active energy ray polymerization initiator (B), the same polymerization initiator used in the active energy ray curable resin composition (X) may be used. The amount of the active energy ray polymerization initiator (B) may be comparable to the amount of the active energy ray polymerization initiator used in the active energy ray curable resin composition (X).

As for the release agent (C), the same release agent used in the active energy ray curable resin composition (X) may be used. Relative to 100 parts by mass of the polymerizable compound (A), the amount of the release agent (C) is usually about 0.1 parts by mass.

Other additives may be exemplified as the same other additives described above.

(Other Components)

The active energy ray curable resin composition, if necessary, may optionally include additives like non-reactive polymers, the active energy ray sol-gel reaction composition, an antistatic agent, a stain-proof agent such as fluorocompounds, particles and small amounts of solvents.

The non-reactive polymer may be exemplified as acrylic resins, styrene resins, polyurethane, cellulose resins, polyvinyl butyral, polyesters, thermoplastic elastomers and the like.

The active energy ray sol-gel reaction composition may be exemplified as alkoxysilane compounds, alkyl silicate compounds and the like.

The alkoxysilane compound may be exemplified as tetramethoxysilane, tetra-i-propoxysilane, tetra-n-propoxysilane, tetra-n-butoxysilane, tetra-sec-butoxysilane, tetra-t-butoxysilane, methyltriethoxysilane, methyl tripropoxy silane, methyl tributoxy silane, dimethyl dimethoxy silane, dimethyl diethoxy silane, trimethyl ethoxy silane, trimethyl methoxy silane, trimethyl propoxy silane, trimethyl butoxy silane and the like.

The alkyl silicate compounds include methyl silicate, ethyl silicate, isopropyl silicate, n-propyl silicate, n-butyl silicate, n-pentyl silicate, acetyl silicate and the like.

(Hydrophobic Materials)

In order to maintain the water contact angle of the surface of the uneven microstructure of the cured resin layer at 90° or more, it is preferred to use a composition including the fluorine-containing compound or the silicone compounds as the active energy ray curable resin composition capable of forming the hydrophobic material.

Fluorine-Containing Compounds:

The fluorine-containing compounds may be fluorine-containing monomers, fluorine-containing silane coupling agents, fluorine-containing surfactants, fluorine-containing polymers and the like.

The fluorine-containing monomer may be fluoroalkyl-substituted vinyl monomers, fluoroalkyl-substituted ring-opening polymerizable monomers and the like.

Fluoroalkyl-substituted vinyl monomers may be fluoroalkyl-substituted (meth)acrylates, fluoro alkyl-substituted (meth)acrylamides, fluoro alkyl-substituted vinyl ethers, fluoroalkyl-substituted styrenes and the like.

Fluoroalkyl-substituted ring-opening polymerizable monomers may be fluoroalkyl-substituted epoxy compounds, fluoroalkyl-substituted oxetane compounds, fluoroalkyl-substituted oxazoline compounds, and the like.

The fluorine-containing silane coupling agents may be 3,3,3-trifluoropropyl trimethoxysilane, 3,3,3-trifluoropropyl triacetoxy silane, dimethyl-3,3,3-trifluoropropyl methoxysilane, tridecafluoro-1,1,2,2-tetrahydrooctyl triethoxysilane, and the like.

The fluorine-containing surfactants may be an anionic surfactant containing a fluoroalkyl group, a cationic surfactant containing a fluoroalkyl group, and the like.

The fluorine-containing polymers may be exemplified as polymers of fluoroalkyl group-containing monomers, copolymers of fluoroalkyl group-containing monomers and poly(oxyalkylene) group-containing monomers, copolymers of fluoroalkyl group-containing monomers and crosslinking reactive group-containing monomers, and the like. The fluorine-containing polymers may be a copolymer with other copolymerizable monomers.

Silicone Compounds:

The silicone compounds may be (meth)acrylic-modified silicone, silicone resins, silicone-based silane coupling agents and the like.

(Meth)acrylic-modified silicone may be exemplified as silicone-modified (di)(meth)acrylate and the like. For example, it is preferred to use silicone diacrylate "x-22-164", "x-22-1602" manufactured by Shin-Etsu Chemical Co., Ltd.

(Hydrophilic Material)

In order to maintain the water contact angle of the surface of the uneven microstructure of the cured resin layer at 25° or less, it is preferred to use a composition at least including the hydrophilic monomers as the active energy ray curable resin composition capable of forming the hydrophilic material. In view of the scratch resistance or the water resistance of the cured resin layer, the composition including the crosslinking reactive polyfunctional monomers is preferred. In addition, the hydrophilic monomer may be the same as the crosslinking reactive polyfunctional monomers (i.e. hydrophilic polyfunctional monomers). Moreover, the active energy ray curable resin composition may include other monomers.

The active energy ray curable resin composition capable of forming the hydrophilic material preferably uses a composition including, polyfunctional (meth)acrylate having 4 or more functional groups, hydrophilic (meth)acrylate having 2 or more functional groups and monofunctional monomers if needed.

Polyfunctional (meth)acrylate having 4 or more functional groups may be exemplified as ditrimethylolpropane tetra(meth)acrylate, pentaerythritol tetra(meth)acrylate, pentaerythritol ethoxy tetra(meth)acrylate, dipentaerythritol hydroxy penta(meth)acrylate, dipentaerythritol hexa(meth)acrylate, condensation reaction mixtures of succinic acid/trimethylolethane/acrylic acid, in the molar ratio of 1:2:4, urethane acrylates (manufactured by DAICEL-CYTEC Co.: EBECRYL220, EBECRYL1290, EBECRYL1290K, EBECRYL5129, EBECRYL8210, EBECRYL8301, KRM8200), polyether acrylates (manufactured by DAICEL-CYTEC Ltd Co.: EBECRYL81), modified epoxy acrylates, (manufactured by DAICEL-CYTEC Co.: EBECRYL3416), polyester acrylates (manufactured by DAICEL-CYTEC Co.: EBECRYL450, EBECRYL657, EBECRYL800, EBECRYL810, EBECRYL811, EBECRYL812, EBECRYL1830, EBECRYL845, EBECRYL846, EBECRYL1870), and the like.

These compounds may be used in a combination of two or more kinds or may be used singly.

The polyfunctional (meth)acrylate having 4 or more functional groups is more preferably polyfunctional (meth)acrylate having 5 or more functional groups.

The proportion of the polyfunctional (meth)acrylate having 4 or more functional groups is preferably 10-50 mass %, from the viewpoint of water resistance and chemical resistance, more preferably 20-50 mass %, and particularly preferably 30-50 mass %. When the proportion of the polyfunctional (meth)acrylate having 4 or more functional groups is equal to or more than 10 mass %, the curable resin composition offers a higher modulus of elasticity and the abrasion resistance of the cured resin layer is enhanced. When the proportion of the polyfunctional (meth)acrylate of more than 4 functional groups is equal to or less than 50 mass %, small crack on the surface is difficult to form, and poor appearance is difficult to occur.

The hydrophilic (meth)acrylate having 2 or more functional groups may be exemplified as polyfunctional acrylates having a long-chain polyethylene glycol such as ARONIX M-240, ARONIX M260 (manufactured by Toagosei Co., Ltd.), NK Ester AT-20E, NK ester ATM-35E (manufactured by Shin-Nakamura Chemical Co.), and polyethylene glycol di(meth)acrylate and the like. These compounds may be used in a combination of two or more kinds or may be used singly.

For the polyethylene glycol di(meth)acrylate, the sum of the average repeating units of the polyethylene glycol chain present in one molecule, is preferably 6-40, more preferably 9-30, and particularly preferably 12-20. When the average number of repeating units of the polyethylene glycol chain is equal to or more than 6, the hydrophilicity of the curable resin composition is sufficient and the stain-proof properties of the cured resin layer are improved. When the average number of repeating units of the polyethylene glycol chain is equal to or less than 40, the compatibility between polyethylene glycol di(meth)acrylate and the polyfunctional (meth)acrylate having 4 or more functional groups becomes good, and it is difficult to separate the active energy ray curable resin composition.

The proportion of hydrophilic (meth)acrylate having 2 or more functional groups may be preferably 30-80 mass %, more preferably 40-70 mass %. When the proportion of hydrophilic (meth)acrylate having 2 or more functional groups is equal to or more than 30 mass %, the hydrophilicity of the curable resin composition is sufficient and the stain-proof properties of the cured resin layer are improved. When the proportion of hydrophilic (meth)acrylate having 2 or more functional groups is equal to or less than 80 mass %, the curable resin composition offers a higher modulus of elasticity and the abrasion resistance of the cured resin layer is enhanced.

Monofunctional monomer is preferably a hydrophilic monofunctional monomer.

The hydrophilic monofunctional monomers may be exemplified as monofunctional (meth)acrylates having a polyethylene glycol chain in an ester group, such as M-20G, M-90G, M-230G (manufactured by Shin-Nakamura Chemical Co.) and the like; monofunctional (meth)acrylates having a hydroxyl in an ester group such as hydroxyalkyl (meth)acrylate and the like; monofunctional acrylamides; cationic monomers such as methacrylamide propyl trimethyl ammonium methyl sulfate, methacryloyloxyethyl trimethyl ammonium methyl sulfate and the like.

Further, the monofunctional monomer may use viscosity modifiers such as acryloyl morpholine, vinyl pyrrolidone and the like and adhesion enhancers such as the class of acryloyl isocyanate, to improve the adhesion to the body of the product.

The proportion of the monofunctional monomer is preferably 0-20 mass %, more preferably 5-15 mass %. By using the monofunctional monomer, the adhesion between the substrate and the cured resin is improved. If the proportion of the monofunctional monomer is equal to or less than 20 mass %, without insufficient polyfunctional (meth)acrylate having 4 or more functional groups or hydrophilic (meth)acrylate having 2 or more functional groups, the stain-proof property or abrasion resistance of the cured resin layer is fully presented.

One, two or more kinds of the monofunctional monomers may be (co)polymerized into a polymer of low degree of polymerization and blended in 0-35 parts by mass into the active energy ray curable resin composition. The polymer of low polymerization degree may be monofunctional (meth)acrylates having a polyethylene glycol chain in an ester group such as M-230G (manufactured by Shin-Nakamura Chemical Co.) and the like, and methacrylamide propyl trimethyl ammonium methyl sulfate 40/60 co-polymerized oligomer (manufactured by MRC Unitech, MG polymer) and the like.

(Operation and Effect)

Regarding the active energy ray curable resin composition (X) as described above, an active energy ray of the accumulated energy of 1000 mJ/cm$^2$ is irradiated so that the cured article of the active energy ray curable resin composition has an indentation elastic modulus of 5-1000 MPa at 23° C. In addition, regarding the active energy ray curable resin composition (X) used in the producing method of the product having the surface uneven microstructure further including the step of treating the mold with the external release agent before Step (I), the indentation elastic modulus is 5-2000 MPa at 23° C. Hence, excellent releasability can be uniformly and simply imparted to the surface of the mold having the surface uneven microstructure in a short period of time.

<Mold Release Treatment Method>

The mold release treatment method of the invention is to supply the active energy ray curable resin composition (X) to the surface of the mold having the surface uneven microstructure, cure by irradiation with an active energy ray thereto, and peel off the cured article of the active energy ray curable resin composition (X) from the surface of the mold. In this case, the active energy ray curable resin composition (X) is preferably cured in a state of being nipped between the substrate and the mold to form a cured resin layer transferred with uneven microstructures on the surface of the substrate.

By the above method for the mold release treatment, extraneous substances adhered to the uneven microstructure of the mold are removed from the mold by affixing to the active energy ray curable resin composition (X). At the same time, because the mold surface is coated with the release agent (C) that has been transited from the active energy ray curable resin composition (X), the surface of the mold can be sufficiently and evenly treated by using the release agent. Further, as the cured article of the active energy ray curable resin composition (X) has a specific indentation elastic modulus and includes certain amounts of the release agent (C), the cured article of the active energy ray curable resin composition (X) hardly remains on the surface of the mold.

(Substrate)

The material of the substrate may be exemplified as methyl methacrylate (co)polymer, polycarbonate, styrene (co)polymers, methyl methacrylate-styrene copolymer, semi-synthetic polymers (cellulose diacetate, cellulose triacetate, cellulose acetate butyrate, etc.), polyesters such as (polyethylene terephthalate, etc.), polyamide, polyimide, polyether sulfone, polysulfone, polyethylene, polypropylene, polymethyl pentene, polyvinyl chloride, polyvinyl acetal, polyether ketone, polyurethane, glass and the like.

The shape of the substrate may be exemplified as a film, a sheet, an injection molded article, a press molded article, an extruded molded article, a cast molded article, and the like.

To the surface of the substrate may be subjected to the coating treatment or the corona treatment for the purpose of improving adhesion properties, antistatic properties, abrasion resistance, and weather resistance, coating.

(Operation and Effect)

Regarding the active energy ray curable resin composition (X) used in the producing method of the product having the surface uneven microstructure further including the step of treating the mold with the external release agent before Step (I), the above indentation elastic modulus is 5-2000 MPa at 23° C. Hence, excellent releasability can be uniformly and simply imparted to the surface of the mold having the surface uneven microstructure in a short period of time.

EXAMPLES

Hereinafter, by way of the examples, the present invention will be described in details but the present invention is not limited to these examples.

(Pores of Anodized Alumina)

A part of the anodized alumina was cut, and platinum was deposited on its cross-section for one minute. The field emission scanning electron microscope (manufactured by JEOL, JSM-7400F) was used under the conditions of the accelerating voltage 3.00 kV to observe the cross-section and measure the pore interval and the depth of the pores.

Production Example 1

An aluminum plate of 99.99% purity was buffed and then mirror-polishing in an electrolytic solution of perchloric acid/ethanol mixture (volume ratio 1/4).

Step (a):

With 0.3M aqueous solution of oxalic acid and 40V DC, anodization of the aluminum plate was carried out for 30 minutes under the conditions of temperature 16° C.

Step (b):

The aluminum plate formed with the oxide film was immersed in a mixed aqueous solution of 6 mass % chromic acid/1.8 mass % phosphoric acid for 6 hours to remove the oxide film.

Step (c):

With an aqueous solution of 0.3M oxalic acid and 40V DC, anodization of the aluminum plate was carried out for 30 seconds under the temperature condition of 16° C.

Step (d):

The aluminum plate formed with the oxide film was immersed in an aqueous solution of 5 mass % phosphoric acid for 8 minutes at 32° C., so as to perform the pore diameter-expanding treatment.

Step (e):

With an aqueous solution of 0.3M oxalic acid and 40V DC, anodization of the aluminum plate was carried out for 30 seconds under the temperature condition of 16° C.

Step (f):

The previous Step (d) and Step (e) were repeatedly performed for 4 times in total and ended with Step (d), so as to obtain the anodized alumina mold having the substantially cone shaped pores with the average interval of the pores being 100 nm and pore depth being 180 nm formed on the surface thereof.

The obtained mold was washed with the deionized water and blow-dried to remove the water on the surface.

Example 1

(Shaping Method in Batches)
(Preparation of the Active Energy Ray Curable Resin Composition for Mold Surface Release Treatment)

The active energy ray curable resin composition (X) including the following components was prepared:

50 parts by mass of urethane acrylate of two functional groups (manufactured by Toagosei, ARONIX M1200), 50 parts by mass of polyethylene glycol diacrylate (manufactured by Toagosei, ARONIX M260), 3.0 parts by mass of 1-hydroxycyclohexyl phenyl ketone (manufactured by Ciba Specialty Chemicals Inc., IRGACURE 184), 5.0 parts by mass of polyoxyethylene alkyl phosphate ester compound (manufactured by Axel Co., MOLD Uiz INT-1856).

(Preparation of the Active Energy Ray Curable Resin Composition for Shaping)

The active energy ray curable resin composition (Y) including the following components was prepared:

45 parts by mass of the condensation reaction mixture of trimethylolethane/acrylic acid/succinic anhydride (manufactured by Osaka Organic Chemical Industry Co., TAS), 10 parts by mass of silicone diacrylate (Shin-Etsu Chemical Industry Co., Ltd., X-22-1602), 45 parts by mass of 1,6-hexanediol diacrylate, 3.0 parts of 1-hydroxy-cyclohexyl-phenylketone (manufactured by Ciba Specialty Chemicals Co., IRGACURE (registered mark) 184), 0.2 parts by mass of bis(2,4,6-trimethyl benzoyl)-phenyl phosphine oxide (manufactured by Ciba Specialty Chemicals Co., IRGACURE (registered mark) 819), 0.1 parts by mass of (poly)oxyethylene alkyl phosphate ester compound (manufactured by Axel Co., mold Uiz INT-1856).

(Mold Release Treatment using an Active Energy Ray Curable Resin Composition)

1 drop of the active energy ray curable resin composition (X) was supplied on the surface of the mold, and then the polyethylene terephthalate film (manufactured by Toyobo Co., Ltd., A-4300) of 188 μm thick was arranged over the mold and the resin composition was spread between the film and the mold. At this time, about 20-40% of the surface of the mold was covered by the active energy ray curable resin composition (X). The composition was cured by irradiation with ultraviolet light with the energy of 1000 mJ/cm$^2$ using the electrodeless UV lamp (manufactured by Fusion UV Systems, Light Hammer 6) from the film side. The film were peeled off from the mold and the release agent was transferred to a portion of the mold coated with the active energy ray curable resin composition (X) (first dummy shaping).

Then, 2 drops of the active energy ray curable resin composition (X) were supplied on the surface of the mold, in the same manner as above. The active energy ray curable resin composition (X) covered about 40-80% of the surface of the mold and was cured by irradiation with ultraviolet light. The film were peeled off from the mold and the release agent was transferred to a portion of the mold coated with the active energy ray curable resin composition (X) (second dummy shaping).

Moreover, 3 drops of the active energy ray curable resin composition (X) were supplied on the surface of the mold, in the same manner as described above, and the entire surface of the mold was covered by the active energy ray curable resin composition (X). The composition was cured by irradiation with ultraviolet light. The film were peeled off from the mold and the release agent was transferred to the whole surface of the mold (third dummy shaping).

As described above, the mold was treated by the release treatment.

(Production of the Product)

3 drops of the active energy ray curable resin composition (Y) were dropped on the surface of the mold, and the polyethylene terephthalate film (manufactured by Toyobo Co., Ltd., A-4300) of 188 μm thick was arranged over the mold and the resin composition was spread between the film and the mold. The active energy ray curable resin composition (Y) was cured by irradiation with ultraviolet light with the energy of 1000 mJ/cm$^2$ using the electrodeless UV lamp (manufactured by Fusion UV Systems, Light Hammer 6) from the film side. The film were peeled off from the mold to obtain a product having an uneven microstructure on the surface thereof (regular shaping).

The same operation was repeated three times in total, and the product having the uneven microstructure thereon obtained in the third operation was evaluated.

Example 4

(Continuously Shaping Method)

An aluminum substrate in a roll form was prepared (purity 99.99%).

Step (a):

With an aqueous solution of 0.3M oxalic acid and 40V DC, anodization of the aluminum substrate was carried out for 6 hours under the temperature condition of 16° C.

Step (b):

The aluminum substrate with the oxide film formed thereon was immersed for 6 hours in a mixed aqueous solution of 6 mass % phosphoric acid/1.8 mass % chromic acid, to remove the oxide film.

Step (c):

With an aqueous solution of 0.3M oxalic acid and 40V DC, anodization of the aluminum substrate was carried out for 20 seconds under the temperature condition of 16° C.

Step (d):

The aluminum substrate with the oxide film formed thereon was immersed in an aqueous solution of 5 mass % phosphoric acid for 8 minutes at 32° C., to perform the pore diameter-expanding treatment.

Step (e):

The previous Step (d) and Step (d) were repeatedly performed for 4 times in total, and Step (d) was performed last of all, so as to obtain the roll mold of anodized alumina, the anodized alumina having the substantially cone shaped pores with the average interval of the pores being 100 nm and pore depth being 220 nm.

(Step (I) and Step (II))

Using the apparatus shown in FIG. 2, step (I) and step (II) were carried out.

A roll mold 20 was used as the above roll mold (a).

The active energy ray curable resin composition (X) was used as the first curable resin 38, while the active energy ray curable resin composition (Y) was used as the second curable resin 39.

A polyester film (manufactured by Mitsubishi Plastics, W32A, thickness: 88 μm, width: 300 mm) was used as the film 42.

While the strip film 42 moved along the surface of the roll mold 20 in synchronization with the rotation of the roll mold 20, the first curable resin 38 was supplied between the film 42 and the roll mold 20 from the tank 22.

The first curable resin 38 was cured by irradiating UV light of the accumulated energy of 1100 mJ/cm$^2$ to the first curable resin 38 from(through) the side of the film 42, so that a cured resin layer 44 was formed on the surface of the film 42.

After forming the cured resin layer 44 on the surface of the film 42 of 200 meters long, the supply of the first curable resin 38 from the tank 22 was stopped and subsequently the second curable resin 39 was supplied between the film 42 and the roll mold 20 from the tank 23.

The second curable resin 39 was cured by irradiating UV light of the accumulated energy of 1100 mJ/cm$^2$ to the second curable resin 39 from the side of the film 42, so that a cured resin layer 44 was formed on the surface of the film 42.

After forming the cured resin layer 44 on the surface of the film 42 of 200 meters long, the supply of the second curable resin 39 from the tank 23 was stopped, and then the movement of the film 42 was stopped. The surface of the cured resin layer 44 was visually observed, and the observed result indicated that for every meter of the film, zero to two defects, such as poor mold release, residual resin or defects caused by extraneous substances, existed on the film.

In addition, the indentation elastic modulus of the first curable resin A was 34 Mpa.

Examples 2-3 and 5-19

Except for changing the active energy ray curable resin composition (X) to the composition as shown in Tables 1-3 and setting the shaping method as the methods shown in the tables, products having the uneven microstructure on the surface thereof were obtained by using the same methods of Example 1 or Example 4.

Examples 20-23

Except for changing the active energy ray curable resin composition (X) to the composition as shown in Table 2 and Table 3 and setting the shaping method as the methods shown in the tables for performing the mold release treatment of the mold using the external release agent, the products having the uneven microstructure on the surface thereof were obtained by using the same methods of Example 1.

(Mold Release Treatment of Plate-Shaped Mold using External Release Agent)

Stain-proof surface coating agent (manufactured by Daikin Industries, OPTOOL DSX) was diluted with a diluent (manufactured by Harves Co., HD-ZV) so as prepare the release agent solution to have a solid content concentration of 0.1 mass %.

For performing the mold release treatment, the mold that was obtained in the same manner as in Production Example 1 was immersed in the release agent solution for 10 minutes and air-dried for 20 hours.

Preparation Example

The first curable resin A and the second curable resin B were prepared by mixing the components in the following ratios.

(First Curable Resin A)

82 parts by mass of the condensation reaction mixture of succinic acid/trimethylolethane/acrylic acid (manufactured by Osaka Organic Chemical Industry, TAS), 6 parts by mass of polyethylene glycol diacrylate (manufactured by Toagosei, ARONIX M260), 4 parts by mass of 2-hydroxyethyl acrylate, 8 parts by mass of methyl acrylate, 0.3 parts by mass of (poly)oxyalkylene alkyl phosphate ester compound (manufactured by Axel Co., INT-1856), 1 part of 1-hydroxy-cyclohexyl-phenylketone (manufactured by Ciba Specialty Chemicals Co., IRGACURE 184), 0.1 parts by mass of bis(2,4,6-trimethyl benzoyl)-phenyl phosphine oxide (manufactured by Ciba Specialty Chemicals Co., IRGACURE 819).

(Second Curable Resin B)

45 parts by mass of the condensation reaction mixture of succinic acid/trimethylolethane/acrylic acid (manufactured by Osaka Organic Chemical Industry Co., TAS), 45 parts by mass of 1,6-hexanediol diacrylate (manufactured by Osaka Organic Chemical Industry Co., C6DA), 10 parts by mass of silicone diacrylate (Shin-Etsu Chemical Industry Co., Ltd., X-22-1602), 3.0 parts of 1-hydroxy-cyclohexyl-phenylketone (manufactured by Ciba Specialty Chemicals Co., IRGACURE 184), 0.2 parts by mass of bis(2,4,6-trimethyl benzoyl)-phenyl phosphine oxide (manufactured by Ciba Specialty Chemicals Co., IRGACURE 819).

Example 24

Aluminum substrate (99.99% purity) in a roll form was prepared. The active energy ray curable resin composition (X) was changed to the composition(s) shown in Table 3, and steps (a)-(e) were performed in the same manner as in Example 4, followed by performing the step (i) and step (j). Subsequently, the first curable resin A was used as the first curable resin 38, while the second curable resin B was used as the second curable resin 39. In addition, the above steps (I) and (II) were performed in the same manner as in Example 4.

(Mold Release Treatment of Roll Mold using External Release Agent)

Step (i):

The mold was immersed in a diluted solution of 0.1 mass % OPTOOL DSX (manufactured by Industries, Ltd.).

Step (j):

The mold was air-dried overnight to obtain a roll-shaped mold a that has been treated with a release agent.

After forming the cured resin layer 44 on the surface of the film 42 of 200 meters long, the supply of the second curable resin 39 from the tank 23 was stopped. Then, the movement of the film 42 was stopped. The surface of the cured resin layer 44 was visually observed, and the observed result indicated that for every meter of the film, zero to two defects (0-2 defects per 0.1 m$^2$), such as poor mold release, residual resin or defects caused by extraneous substances, existed on the film.

In addition, the indentation elastic modulus of the first curable resin A was 1820 Mpa, and the indentation elastic modulus of the second curable resin B was 2050 Mpa.

Example 25

Except for using TDP-2 (manufactured by Nikko Chemicals) as (poly)oxyalkylene alkyl phosphate ester compound (internal release agent) of the first curable resin A, each step was performed in the same way as in Example 24. The surface of the cured resin layer 44 after performing Step (II) was visually observed, and the observed result indicated that for every meter of the film, zero to two defects (0-2 defects per 0.1 m$^2$), such as poor mold release, residual resin or defects caused by extraneous substances, existed on the film.

In addition, the indentation elastic modulus of the first curable resin A at this time was 1820 MPa.

Example 26

Except for changing the first curable resin A to the following composition, each step was performed in the same manner as in Example 24.

(First Curable Resin A)

70 parts by mass of the condensation reaction mixture of succinic acid/trimethylolethane/acrylic acid (manufactured by Osaka Organic Chemical Industry, TAS), 20 parts by mass of polyethylene glycol diacrylate (manufactured by Toagosei, ARONIX M260), 3 parts by mass of 2-hydroxyethyl acrylate, 7 parts by mass of methyl acrylate, 0.3 parts by mass of (poly)oxyalkylene alkyl phosphate ester compound (manufactured by Nikko Chemicals, TDP-2), 1 part of 1-hydroxy-cyclohexyl-phenylketone (manufactured by Ciba Specialty Chemicals Co., IRGACURE 184), 0.1 parts by mass of bis(2,4,6-trimethyl benzoyl)-phenyl phosphine oxide (manufactured by Ciba Specialty Chemicals Co., IRGACURE 819).

The surface of the cured resin layer 44 after performing Step (II) was visually observed, and the observed result indicated that for every meter of the film, zero to two defects, such as poor mold release, residual resin or defects caused by extraneous substances, existed on the film.

In addition, the indentation elastic modulus of the first curable resin A at this time was 1450 MPa.

Comparative Example 1

In the same manner as in Example 24, a roll-shaped mold (a) treated with the external release agent was obtained.

(Step (II))

Step (II) was performed using the apparatus shown in FIG. 2.

The above described roll-shaped mold (a) was used as the roll-shape mold 20.

The second curable resin B was used as the second curable resin 39. Table 3 lists the composition of the second curable resin B and the indentation elastic modulus thereof.

A polyester film (manufactured by Mitsubishi Plastics, W32A, thickness: 88 μm, width: 300 mm) was used as the film 42.

While the strip film 42 moved along the surface of the roll mold 20 in synchronization with the rotation of the roll mold 20, the second curable resin 39 was supplied between the film 42 and the roll mold 20 from the tank 23.

The second curable resin 39 was cured by irradiating UV light of the accumulated energy of 1100 mJ/cm² to the second curable resin 39 from the side of the film 42, so that a cured resin layer 44 was formed on the surface of the film 42.

After forming the cured resin layer 44 on the surface of the film 42 of 200 meters long, the supply of the second curable resin 39 from the tank 23 was stopped. Then, the movement of the film 42 was stopped. The surface of the cured resin layer 44 was visually observed, and the observed result confirmed that minute defects, more than 20 defects in every meter (equivalent to more than 15 defects per 0.1 m²), due to poor mold release, existed over the whole length of the film.

Comparative Example 2

A plate-shaped mold that has been treated with the external release agent was prepared in the same manner as in Example 20.

(Production of the Product)

Except for using the above prepared mold, product having the surface uneven microstructure was prepared in the same manner as in "production of the product" in Example 1 using the active energy ray curable resin composition (Y). In addition, the indentation elastic modulus of the active energy ray curable resin composition (Y) was 1948 MPa. Table 3 shows the composition of the active energy ray curable resin composition (Y) and the indentation elastic modulus thereof.

Comparative Example 3

Except for using the following resin as the second curable resin 39, each step was performed in the same manner as in Comparative Example 1.

(Second Curable Resin 39)

45 parts by mass of the condensation reaction mixture of succinic acid/trimethylolethane/acrylic acid (manufactured by Osaka Organic Chemical Industry Co., TAS), 45 parts by mass of 1,6-hexanediol diacrylate (manufactured by Osaka Organic Chemical Industry Co., C6DA), 10 parts by mass of silicone diacrylate (Shin-Etsu Chemical Industry Co., Ltd., X-22-1602), 0.3 parts by mass of (poly)oxyalkylene alkyl phosphate ester compound (manufactured by Axel Co., INT-1856), 3.0 parts of 1-hydroxy-cyclohexyl-phenylketone (manufactured by Ciba Specialty Chemicals Co., IRGACURE 184), 0.2 parts by mass of bis(2,4,6-trimethyl benzoyl)-phenyl phosphine oxide (manufactured by Ciba Specialty Chemicals Co., IRGACURE 819).

In addition, the indentation elastic modulus of the second curable resin 39 is 1985 MPa. Table 3 shows the composition of the second curable resin 39 and the indentation elastic modulus thereof.

Comparative Example 4

(Production of the Product)

Except for not performing the release treatment of the mold with the active energy ray curable resin composition, product having the surface uneven microstructure was prepared in the same manner as in "production of the product" in Example 1 using the active energy ray curable resin composition (Y). Table 3 shows the composition of the active energy ray curable resin composition (Y) and the indentation elastic modulus thereof.

[Evaluation]

The products obtained in Examples 1 to 26, Comparative Examples 1 to 4 were evaluated for (1) to (4) as described below.

The products obtained in Comparative Examples 1 to 4 were evaluated for (2) to (4) as described below.

Evaluation (1), for the batch method, the products prepared using the dummy for shaping 3 were evaluated. For the continuous method, the product using the first curable resin after shaping for 200 meters was evaluated.

Evaluations (2)-(4), for the batch method, the products prepared by the third operation of regular shaping were evaluated. For the continuous method, the product using the second curable resin after shaping for 200 meters was evaluated.

The evaluation results are shown in Tables 1-3.

(1) Indentation Elastic Modulus:

Ultra-microhardness test system (manufactured by Fischer, Fischer Scope HM2000) was used to measure the indentation elastic modulus. As for the indenter, Vickers pyramid (material: diamond) was used. The indentation elastic modulus was measured by cutting out a sample of 10 mm×10 mm from the product, placed on a slide glass using the side of the cured resin layer as the upper surface, and then pushing perpendicularly to the sample. More specifically, the following procedure was measured in a thermostatic chamber of 23° C.

(1-1) Loading the load in a load speed of 0.5 mN/sec until the load reached 10 mN.

(1-2) Maintained for 15 seconds in a state where the maximum load was loaded.

(1-3) Unloading the load in an unloading speed of 1.9 mN/sec until the load reached 0.4 mN.

(1-4) While changing the measurement positions, the series of steps (1-1)-(1-3) were repeated and the average value of two points was adopted.

(2) Reflection Characteristics:

For the product with its backside being blacked, the relative reflectivity between the wavelengths of 380 nm-780 nm under the condition of an incident angle of 5° was measured by the spectrophotometer (Hitachi, U-4100). For the reflectivity of 550 nm, the evaluation was based on the following criteria.

○: the reflectivity of 550 nm equal to or less than 0.5%.

×: the reflectivity of 550 nm equal to or more than 0.5%.

(3) Surface Characteristics:

1 μL of ion exchanged water was supplied to the product surface, and the contact angle was measured by the automatic contact angle determination device (manufactured by Kruss Company) using the θ/2 method, and the evaluation was based on the following criteria.

○: water contact angle of 120°-less than 140°.

×: water contact angle equal to or more than 140° or less than 120°.

(4) Appearance Evaluation:

For the batch process, the regular shaping product after transferring the resin composition of Example 24 three times was evaluated by visual observation. For the continuous process, the regular shaping product after using the second curable resin for shaping 200 meters was evaluated by visual observation.

Appearance evaluation criteria are as follows.

Level A: occurrence frequency of the defect in the appearance is 0-2 defects per 0.1 m².

Level B: occurrence frequency of the defect in the appearance is 3-14 defects per 0.1 m².

Level C: occurrence frequency of the defect in the appearance is more than 15 defects per 0.1 m².

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Polymerizable compound (A) | ATM-4E |  |  |  |  |  |  |  |  | 30 | 30 |
|  | ATM-35E |  |  |  |  |  |  |  | 30 |  |  |
|  | TAS |  |  |  |  |  |  |  |  |  |  |
|  | U-2PPA |  |  |  |  |  |  | 20 |  |  |  |
|  | R-1150D |  |  |  |  |  |  |  |  |  |  |
|  | A-BPE-10 |  |  |  |  |  | 100 |  |  |  |  |
|  | M1200 | 50 | 50 | 50 | 50 |  |  |  | 30 |  |  |
|  | M260 | 50 | 50 | 50 | 50 | 100 |  | 60 | 30 | 70 | 70 |
|  | x-22-1602 |  |  |  |  |  |  |  |  |  |  |
|  | C6DA |  |  |  |  |  |  |  |  |  |  |
|  | HEA |  |  |  |  |  |  | 20 | 10 |  |  |
|  | 2-hydroxyethyl acrylate methylacrylate |  |  |  |  |  |  |  |  |  |  |
| active energy ray polymerization initiator (B) | Irg.184 | 3.0 | 3.0 | 3.0 | 3.0 | 1.5 | 3.0 | 1.5 | 1.5 | 1.5 | 1.5 |
|  | Irg.819 |  |  |  |  |  |  |  |  |  |  |
| release agent (C) (internal release agent) | INT1856 | 5.0 |  | 0.5 | 0.5 | 1.5 | 5.0 | 3.0 | 3.0 | 5.0 | 8.0 |
|  | JP506H |  | 5.0 |  |  |  |  |  |  |  |  |
|  | TDP-2 |  |  |  |  |  |  |  |  |  |  |
| external release agent | DSX | no | no | no | no | no | no | no | no | no | no |
| substrate |  | A4300 | A4300 | A4300 | W32A | A4300 | A4300 | A4300 | A4300 | A4300 | A4300 |
| shaping method |  | batch | batch | batch | continuous | batch | batch | batch | batch | batch | batch |
| indentation elastic modulus[MPa] |  | 35 | 37 | 34 | 34 | 94 | 86 | 129 | 254 | 254 | 233 |
| Reflectivity characteristic after 3 transferring (reflectivity) |  | ○ | ○ | ○ | ○ | ○ | ○ | ○ | ○ | ○ | ○ |
| Surface characteristic after 3 transferring (contact angle) |  | ○ | ○ | ○ | ○ | ○ | ○ | ○ | ○ | ○ | ○ |
| Transferring times for reflectivity and contact angle being ○ |  | — | — | — | — | — | — | — | — | — | — |
| Appearance evaluation after 3 transferring |  | A | A | A | A | A | A | A | A | A | A |

TABLE 2

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Polymerizable compound (A) | ATM-4E | 30 | 30 |  |  |  |  |  | 65 |  |  |
|  | ATM-35E |  |  |  |  |  |  |  |  |  |  |
|  | TAS |  |  |  | 50 | 50 |  |  |  | 45 |  |
|  | U-2PPA |  |  |  |  |  |  |  |  |  |  |
|  | R-1150D |  |  | 50 |  |  |  |  |  |  |  |
|  | A-BPE-10 |  |  |  |  |  | 100 |  |  |  | 100 |
|  | M1200 |  |  |  |  |  |  |  |  |  |  |
|  | M260 | 70 | 70 | 50 | 40 | 40 |  | 100 | 35 |  |  |
|  | x-22-1602 |  |  |  |  |  |  |  |  | 10 |  |
|  | C6DA |  |  |  |  |  |  |  |  | 45 |  |
|  | HEA |  |  |  | 10 | 10 |  |  |  |  |  |
|  | 2-hydroxyethyl acrylate methylacrylate |  |  |  |  |  |  |  |  |  |  |
| active energy ray polymerization initiator (B) | Irg.184 | 1.5 | 1.5 | 1.5 | 1.5 | 1.5 | 3.0 | 1.5 | 1.5 | 3.0 | 3.0 |
|  | Irg.819 |  |  |  |  |  |  |  |  | 0.2 |  |
| release agent (C) (internal release agent) | INT1856 | 10.0 | 12.0 | 5.0 | 3.0 | 3.0 | 15 | 0.1 | 3.0 | 5.0 | 15 |
|  | JP506H |  |  |  |  |  |  |  |  |  |  |
|  | TDP-2 |  |  |  |  |  |  |  |  |  |  |
| external release agent | DSX | no | no | no | no | no | no | no | no | no | yes |
| substrate |  | A4300 | A4300 | A4300 | A4300 | W32A | A4300 | A4300 | A4300 | A4300 | A4300 |
| shaping method |  | batch | batch | batch | batch | continuous | batch | batch | batch | batch | batch |
| indentation elastic modulus[MPa] |  | 230 | 219 | 708 | 804 | 804 | 86 | 162 | 1251 | 1846 | 86 |
| Reflectivity characteristic after 3 transferring (reflectivity) |  | ○ | × | ○ | ○ | ○ | × | ○ | ○ | ○ | × |
| Surface characteristic after 3 transferring (contact angle) |  | ○ | × | ○ | ○ | ○ | × | ○ | ○ | × | × |
| Transferring times for reflectivity and contact angle being ○ |  | — | 15 | — | — | — | 25 | — | — | 10 | 130 |
| Appearance evaluation after 3 transferring |  | A | B | A | A | A | C | B | B | B | B |

TABLE 3

|  |  | Example 21 | Example 22 | Example 23 | Example 24 | Example 25 | Example 26 | Comparative Example 1 | Comparative Example 2 | Comparative Example 3 | Comparative Example 4 |
|---|---|---|---|---|---|---|---|---|---|---|---|
| Polymerizable compound (A) | ATM-4E |  | 65 |  |  |  |  |  |  |  |  |
|  | ATM-35E |  |  |  |  |  |  |  |  |  |  |
|  | TAS |  |  | 45 | 82 | 82 | 70 | 45 | 45 | 45 | 45 |
|  | U-2PPA |  |  |  |  |  |  |  |  |  |  |
|  | R-1150D |  |  |  |  |  |  |  |  |  |  |
|  | A-BPE-10 |  |  |  |  |  |  |  |  |  |  |
|  | M1200 |  |  |  |  |  |  |  |  |  |  |
|  | M260 | 100 | 35 |  | 6 | 6 | 20 |  |  |  |  |
|  | x-22-1602 |  |  | 10 |  |  |  | 10 | 10 | 10 | 10 |
|  | C6DA |  |  | 45 |  |  |  | 45 | 45 | 45 | 45 |
|  | HEA |  |  |  |  |  |  |  |  |  |  |
|  | 2-hydroxyethyl acrylate |  |  |  | 4 | 4 | 3 |  |  |  |  |
|  | methylacrylate |  |  |  | 8 | 8 | 7 |  |  |  |  |
| active energy ray polymerization initiator (B) | Irg.184 | 1.5 | 1.5 | 3.0 | 1.0 | 1.0 | 1 | 3 | 3.0 | 3 | 3.0 |
|  | Irg.819 |  |  | 0.2 | 0.1 | 0.1 | 0.1 | 0.2 | 0.2 | 0.2 | 0.2 |
| release agent (C) (internal release agent) | INT1856 | 0.1 | 3.0 | 5.0 | 0.3 |  |  |  | 0.1 | 0.3 | 0.1 |
|  | JP506H |  |  |  |  |  |  |  |  |  |  |
|  | TDP-2 |  |  |  |  | 0.3 | 0.3 |  |  |  |  |
| external release agent | DSX | yes | yes | yes | yes | yes | yes | yes | yes | yes | no |
| substrate |  | A4300 | A4300 | A4300 | W32A | W32A | W32A | W32A | A4300 | W32A | A4300 |
| shaping method |  | batch | batch | batch | continuous | continuous | continuous | continuous | batch | continuous | batch |
| indentation elastic modulus[MPa] |  | 162 | 1251 | 1846 | 1820 | 1820 | 1450 | 2050 | 1948 | 1985 | 1948 |
| Reflectivity characteristic after 3 transferring (reflectivity) |  | ○ | ○ | ○ | ○ | ○ | ○ | ○ | ○ | ○ | n.d. |
| Surface characteristic after 3 transferring (contact angle) |  | x | x | x | ○ | ○ | ○ | ○ | x | ○ | n.d. |
| Transferring times for reflectivity and contact angle being ○ |  | 130 | 140 | 140 | — | — | — | — | 140 | — | — |
| Appearance evaluation after 3 transferring |  | A | A | B | A | A | A | C | C | C | n.d. |

Abbreviations in the tables are as follows.

ATM-4E: ethoxylated pentaerythritol tetra acrylate (manufactured by Shin-Nakamura Chemical Co., NK Ester ATM-4E), ATM-35E: ethoxylated pentaerythritol tetra acrylate (manufactured by Shin-Nakamura Chemical Co., NK Ester ATM-35E), TAS: condensation reaction product of succinic anhydride/trimethylolethane acid/acrylate (manufactured by Osaka Organic Chemical Industry Co., TAS), U-2PPA: urethane acrylate (manufactured by Shin-Nakamura Chemical Co., NK Oligo U-2PPA), R-1150D: urethane acrylate (manufactured by Dai-ichi Kogyo Seiyaku Co., New Frontier R-1150D), A-BPE-10: ethoxylated bisphenol A diacrylate (manufactured by Shin-Nakamura Chemical Co., NK Ester A-BPE-10), M1200: urethane acrylate (manufactured by Toa Gosei, Aronix M1200), M260: polyethylene glycol diacrylate (manufactured by Toa Gosei, Aronix M260), x-22-1602: silicone diacrylate (manufactured by Shin-Etsu Chemical Co., Ltd., x-22-1602), C6DA: 1,6-hexanediol diacrylate, HEA: 2-hydroxyethyl acrylate, Irg. 184: 1-hydroxy-cyclohexyl-phenyl-ketone (manufactured by Ciba Specialty Chemicals Inc., IRGACURE® 184), Irg. 819: bis (2,4,6-trimethyl benzoyl)-phenyl phosphine oxide (manufactured by Ciba Specialty Chemicals, IRGCURE® 819), INT1856: (poly) (poly)oxyethylene alkyl phosphate ester compound (Axel Co., mold Uiz INT-1856), JP506H: (poly)oxyethylene alkyl phosphate ester compound (Johoku Chemical Co., JP-506H), DSX: stain-proof surface coating agent (manufactured by Daikin Industries, OPTOOL DSX), A4300: polyethylene terephthalate film (manufactured by Toyobo Co., COSMOSHINE A-4300, 188 μm thickness).

As apparent from the results of Tables 1-3, the release treatment of the mold has been adequately performed by the dummy shaping in Examples 1 to 26, and the products obtained by regular shaping then showed the good results. Because the application amount of the release agent was increased, the appearance of the regular shaping product of the third operation in Examples 12, 16 and 19 was tinged with white as a whole, which is Level C or B. However, by repeating the regular shaping repetitively for 15 times, 25 times and 10 times respectively, not only the reflectivity characteristics and surface characteristics were improved satisfactory, but also the appearance of the regular shaping product being Level B or C was improved as in good levels. Hence, sufficient release treatment was made possible by the dummy shaping.

Although the surface characteristics were not satisfied after three times of transfer in Examples 19-23, by using the transfer times shown in Table 3 and in Table 2, the surface characteristics were improved satisfactory. Appearance evaluation was good, either level A or B.

Compared with Examples 16-19 without using the external release agent, Examples 20-23 in combination of using the external release agent to treat the mold, the evaluation of the appearance was improved substantially.

In Comparative Examples 1-4, as the active energy ray curable resin composition for the mold surface release treatment and the active energy ray curable resin composition for shaping were substantially the same, the dummy shaping was not performed and the good appearance of the products (regular shaping) could not be obtained.

In Comparative Examples 1 and 3, because it has been treated with the external release agent, the release of the cured resin from the mold was relatively smooth. However, multiple defects were observed in appearance.

In Comparative Example 2, the surface characteristics of the regular shaping product of the third operation became inferior, with high level of defects in the appearance. By repeating the transfer for 140 times or more, the surface characteristics recovered as the external release agent on the surface of the product was dropped, but the appearance was not improved.

In Comparative Example 4, the amount of the release agent was too little and the indentation elastic modulus of the cured article of the active energy ray curable resin composition (X) at 23° C. was greater than 1000 MPa. Thus, even without treating the mold with the external release agent, most of the cured resin could be released from the mold. However, residual resin frequently remained on the uneven microstructure, and as a result products worth for evaluation could not be obtained during regular shaping.

INDUSTRIAL APPLICATIONS

The producing method of the product having the uneven microstructure on the surface thereof as disclosed in the invention is applicable to fabricating antireflection products, anti-fog products, stain-proof products, water-repellent products, and cell culture sheets, etc., with good productivity.

What is claimed is:

1. A method for producing a product having an uneven microstructure on a surface thereof, the producing method comprising the following steps (I)-(II):

step (I) supplying an active energy ray curable resin composition for a mold surface release treatment between a substrate and an unused mold having an uneven microstructure on a surface thereof, the active energy ray curable resin composition for the mold surface release treatment comprises a polymerizable compound (A), an active energy ray polymerization initiator (B), and an internal release agent (C), an amount of the internal release agent (C) contained in the active energy ray curable resin composition for the mold surface release treatment ranges from 0.3 part by mass to 10 parts by mass relative to 100 parts by mass of the polymerizable compound (A), curing the active energy ray curable resin composition for the mold surface release treatment by irradiation with an active energy ray, peeling off the substrate with a cured article of the active energy ray curable resin composition from the surface of the mold, and transiting the internal release agent (C) contained in the active energy ray curable resin composition for the mold surface release treatment to the mold surface, so as to perform a release treatment to the surface of the mold after peeling off the substrate with the cured article, wherein the producing method is initiated by first performing the step (I); and step (II), after the step (I), supplying an active energy ray curable resin composition for shaping, which is different to the active energy ray curable resin composition for the mold surface release treatment, between the substrate and the mold, the surface of which has been treated by the release treatment, the active energy ray curable resin composition for shaping comprises a polymerizable compound (A'), an active energy ray polymerization initiator (B'), and an internal release agent (C'), an amount of the internal release agent (C') contained in the active energy ray curable resin composition for shaping ranges from 0.01 part by mass to 1 part by mass relative to 100 parts by mass of the polymerizable compound (A'), curing the active energy ray curable resin composition for shaping by irradiation with an active energy ray, and peeling off the substrate with a cured article of the active energy ray curable resin composition from the surface of the mold, so as to obtain the product having the uneven microstructure, which corresponds to the uneven microstructure of the mold, on the surface thereof, wherein the uneven microstructure of the mold has pores whose interval is equal or less than 400 nm, the cured article of the resin composition for the mold surface release treatment cured by irradiated with an active energy ray of an accumulated light energy of 1000 mJ/cm$^2$ has an indentation elastic modulus of 5-1000 MPa at 23° C., and the amount of the internal release agent (C) contained in the active energy ray curable resin composition for the mold surface release treatment is more than the amount of an internal release agent (C') contained in the active energy ray curable resin composition for shaping.

2. The producing method of claim 1, further comprising treating the mold with an external release agent before the step (I).

3. The producing method of claim 1, wherein the internal release agent (C) is (poly)oxyalkylene alkyl phosphate ester.

4. The producing method of claim 1, further comprising treating the mold with an external release agent before the step (I), wherein the internal release agent (C) is different from the external release agent.

5. The producing method of claim 2, wherein the external release agent is a fluoro-compound having a hydrolyzable silyl group.

6. The producing method of claim 1, wherein the mold having the uneven microstructure on the surface thereof is a roll mold, and after the active energy ray curable resin composition is supplied between strip substrates that move along the surface of the mold in synchronism with the rotation of the roll mold and cured by irradiation with an active energy ray, the substrate and the cured article of the active energy ray curable resin composition are peeled off from the surface of the mold.

* * * * *